United States Patent
Kirby et al.

(10) Patent No.: US 7,495,316 B2
(45) Date of Patent: Feb. 24, 2009

(54) METHODS OF FORMING CONDUCTIVE VIAS AND METHODS OF FORMING MULTICHIP MODULES INCLUDING SUCH CONDUCTIVE VIAS

(75) Inventors: Kyle K. Kirby, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/868,899

(22) Filed: Oct. 8, 2007

(65) Prior Publication Data

US 2008/0029851 A1 Feb. 7, 2008

Related U.S. Application Data

(62) Division of application No. 11/351,006, filed on Feb. 8, 2006, now Pat. No. 7,282,784, which is a division of application No. 10/931,959, filed on Aug. 31, 2004, now Pat. No. 7,129,567.

(51) Int. Cl.
*H01L 29/40* (2006.01)
(52) U.S. Cl. .............. 257/621; 257/698; 257/774; 257/E23.011; 257/E23.079; 438/667; 438/668
(58) Field of Classification Search ......... 257/621, 257/E23.011
See application file for complete search history.

(56) References Cited

U.S. PATENT DOCUMENTS

| | | | |
|---|---|---|---|
| 3,739,469 A | 6/1973 | Dougherty, Jr. | |
| 4,522,671 A | 6/1985 | Grünwald et al. | |
| 4,543,715 A | 10/1985 | Iadarola et al. | |
| 4,581,301 A * | 4/1986 | Michaelson | 428/551 |
| 4,614,021 A | 9/1986 | Hulseweh | |
| 4,621,045 A | 11/1986 | Goodner | |
| 5,300,911 A | 4/1994 | Walters | |
| 5,321,207 A | 6/1994 | Huang | |
| 5,374,788 A | 12/1994 | Endoh et al. | |
| 5,381,306 A | 1/1995 | Schumacher et al. | |

(Continued)

OTHER PUBLICATIONS

Making Interconnections in Multilayer Boards, IBM Technical Disclosure Bulletin, May 1968, pp. 1985-1986.

(Continued)

*Primary Examiner*—Tu-Tu V Ho
(74) *Attorney, Agent, or Firm*—TraskBritt

(57) ABSTRACT

A method of forming a multiconductor via includes forming at least one seed layer in at least one through-hole of a substrate, selectively patterning the seed layer to form a plurality of laterally separated regions, and depositing metal upon the regions. Alternatively, a through-hole may be substantially filled with dielectric material, a plurality of smaller through-holes may be formed in the dielectric material, and conductive material may be deposited in the smaller holes. Another method includes forming laterally separated protruding structures in a cavity of a substrate, depositing conductive material over the structures and dielectric material between the structures, and thinning the substrate. Alternatively, conductive nanotubes may be formed in the cavity, and dielectric material may be deposited that surrounds the nanotubes. A method of forming a multichip module includes forming at least one via extending through a plurality of stacked dice that includes a plurality of conductive elements.

20 Claims, 20 Drawing Sheets

U.S. PATENT DOCUMENTS

| | | | |
|---|---|---|---|
| 5,421,083 A | 6/1995 | Suppelsa et al. |
| 5,541,567 A | 7/1996 | Fogel et al. |
| 5,619,791 A | 4/1997 | Lambrecht, Jr. et al. |
| 5,623,160 A | 4/1997 | Liberkowski |
| 5,689,091 A | 11/1997 | Hamzehdoost et al. |
| 5,825,084 A | 10/1998 | Lau et al. |
| 5,949,030 A | 9/1999 | Fasano et al. |
| 6,091,027 A | 7/2000 | Hesselbom et al. |
| 6,114,240 A | 9/2000 | Akram et al. |
| 6,137,064 A | 10/2000 | Kiani et al. |
| 6,333,560 B1 | 12/2001 | Uzoh |
| 6,340,822 B1 | 1/2002 | Brown et al. |
| 6,383,923 B1 | 5/2002 | Brown et al. |
| 6,388,208 B1 | 5/2002 | Kiani et al. |
| 6,400,172 B1 | 6/2002 | Akram et al. |
| 6,479,764 B1 | 11/2002 | Frana et al. |
| 6,498,381 B2 | 12/2002 | Halahan et al. |
| 6,528,020 B1 | 3/2003 | Dai et al. |
| 6,605,551 B2 | 8/2003 | Wermer et al. |
| 6,628,053 B1 | 9/2003 | Den et al. |
| 6,673,392 B2 | 1/2004 | Lee et al. |
| 6,683,472 B2 | 1/2004 | Best et al. |
| 6,717,071 B2 | 4/2004 | Chang et al. |
| 6,720,728 B2 | 4/2004 | Den et al. |
| 6,734,373 B2 | 5/2004 | Seki |
| 6,787,710 B2 | 9/2004 | Uematsu et al. |
| 6,829,133 B2 | 12/2004 | Wermer et al. |
| 6,852,627 B2 | 2/2005 | Sinha et al. |
| 7,112,525 B1 | 9/2006 | Bhansali et al. |
| 7,317,166 B2 | 1/2008 | Nakamura |
| 2002/0060361 A1* | 5/2002 | Sasaki ........................ 257/698 |
| 2002/0100608 A1* | 8/2002 | Fushie et al. ................ 174/255 |
| 2003/0211724 A1* | 11/2003 | Haase ........................ 438/629 |
| 2004/0152240 A1 | 8/2004 | Dangelo |
| 2004/0201096 A1* | 10/2004 | Iijima et al. ................. 257/734 |
| 2004/0251047 A1 | 12/2004 | Bartley et al. |
| 2005/0269680 A1 | 12/2005 | Hsuan |

OTHER PUBLICATIONS

Marco Tortonese, "Cantilevers and Tips for Atomic Force Microscopy", IEEE Engineering in Medicine and Biology, Mar./Apr. 1997, pp. 28-33, Park Scientific Instruments, Sunnyvale, CA.

\* cited by examiner

METHODS OF FORMING CONDUCTIVE VIAS AND METHODS OF FORMING MULTICHIP MODULES INCLUDING SUCH CONDUCTIVE VIAS

CROSS-REFERENCE TO RELATED APPLICATIONS

This application is a divisional of application Ser. No. 11/351,006, filed Feb. 8, 2006, now U.S. Pat. No. 7,282,784, issued Oct. 16, 2007, which is a divisional of application Ser. No. 10/931,959, filed Aug. 31, 2004, now U.S. Pat. No. 7,129,567, issued Oct. 31, 2006. The disclosure of each of the previously referenced U.S. patent applications and patents referenced is hereby incorporated by reference in its entirety.

BACKGROUND OF THE INVENTION

1. Field of the Invention

The present invention relates to semiconductor wafers, devices, and components. Particularly, the present invention relates to forming at least one conductive via in a semiconductor substrate including a plurality of conductive elements extending therethrough.

2. Background of Related Art

During the production of electronic devices such as printed circuit boards, semiconductor dice, multichip modules, and chip carriers, the signal carrying capability or density (i.e., the number of signals conducted therethrough) of a conductive via formed through the thickness of a substrate may be limited. A conventional manufacturing process involves drilling, etching or laser cutting a hole through a substrate followed by plating of the sidewall of the hole with a metal so as to provide a single conductive path therethrough.

Accordingly, several conventional approaches have been developed for increasing the signal carrying capability of a conductive via formed in a substrate.

For instance, U.S. Pat. No. 5,300,911 to Walters discloses a structure with coaxial conductive elements forming a conductive via, wherein the conductive elements are used to carry current from two or more coupled windings to form a monolithic transformer. In further detail, through-holes are formed in a fired ceramic ferrite and then are plated with metal. After that, a dielectric is coated over the metal and another layer of metal is plated thereon. Additional conductor layers may be applied to form a third or fourth coaxial conductive structure if needed.

U.S. Pat. No. 5,374,788 to Endoh et al. discloses a structure having a single through-hole that is used for top-to-bottom connection in a printed circuit board. The core metal and via holes in the circuit board are coated with coaxial metal or solder layers to improve adhesion. The layers comprising the coaxial coating are not electrically isolated from each other.

U.S. Pat. No. 5,541,567 to Fogel et al. discloses forming a coaxial conductive via by wire bonding wires to be used as center conductors to a conductive surface and then inserting the protruding wires into through-holes placed in a ceramic or magnetic material layer. This structure is designed to perform like a transformer or inductor. However, the alignment of thousands of pins through an array of thousands of holes may be a difficult process. Further, the finest pitch spacing between conductive vias may be limited.

Also, U.S. Pat. No. 5,619,791 to Lambrecht, Jr., U.S. Pat. No. 4,543,715 to Iadarola et al., U.S. Pat. No. 6,498,381 to Halahan et al., and U.S. Pat. No. 6,388,208 to Kiani et al. each disclose multiconductor via structures and methods for their manufacture.

From the above, it can be seen that a need exists for improved multiconductor via structures, semiconductor dice including same, and methods for producing the same.

BRIEF SUMMARY OF THE INVENTION

The present invention, in a number of exemplary embodiments, relates to via structures and methods of manufacture thereof. The present invention further relates to semiconductor dice, multichip modules, systems including same, and methods of manufacture thereof.

One exemplary embodiment of the present invention encompasses a method of forming at least one multiconductor via. Specifically, a substrate having a first surface and a second, opposing surface may be provided and at least one through-hole extending between the first surface and the second surface may be formed therein. Also, at least one seed layer may be formed within the at least one through-hole and the at least one seed layer may be patterned to form a plurality of laterally separated seed layer regions extending from the first surface to the second surface. Further, a metal may be deposited upon the plurality of laterally separated seed layer regions to form a plurality of conductive elements extending through the at least one through-hole.

Another exemplary embodiment of the present invention encompasses another method of forming at least one multiconductor via. Particularly, a substrate having a first surface and a second, opposing surface may be provided and at least one through-hole extending between the first surface and the second surface may be formed. Further, the at least one through-hole may be substantially filled with a dielectric material and a plurality of smaller through-holes may be formed within the dielectric material. A plurality of conductive elements extending through the at least one through-hole may be formed by depositing a conductive material within each of the plurality of smaller through-holes.

A further exemplary embodiment of the present invention encompasses yet another method of forming at least one multiconductor via. A substrate having a first surface and a second, opposing surface may be provided and at least one cavity extending into the first surface to an intermediate surface lying between the first surface and the second surface may be formed therein. Also, a plurality of protruding structures extending from the intermediate surface of the cavity toward the first surface of the substrate may be formed and conductive material may be deposited over an exterior of the plurality of protruding structures. Dielectric material may be deposited between the conductive material deposited on the exterior of the plurality of protruding structures and the substrate may be thinned from the second, opposing surface to form at least one through-hole, including a plurality of conductive elements also extending therethrough.

Yet a further exemplary embodiment of the present invention encompasses still another method of forming at least one multiconductor via. A substrate having a first surface and a second, opposing surface may be provided and at least one cavity may be formed extending into the first surface and forming an intermediate surface lying between the first surface and the second surface therein. Also, a plurality of conductive nanotubes extending generally from the intermediate surface toward the first surface may be formed. Dielectric material may be deposited within the cavity substantially surrounding conductive nanotubes, and the substrate may be thinned from the second, opposing surface to form at least one through-hole from the at least one cavity including a plurality of conductive nanotubes extending therethrough.

Another exemplary embodiment of the present invention encompasses a semiconductor die, and further encompasses a multichip module. Specifically, a plurality of semiconductor dice may be assembled in a stacked arrangement, each of the plurality of semiconductor dice including at least one via extending therethrough and including a plurality of conductive elements in accordance with the present invention. At least one conductive element of the plurality of conductive elements extending through the at least one via formed through each of the plurality of semiconductor dice may be operably coupled with at least one bond pad thereof, respectively.

In a farther exemplary embodiment of the present invention, a method of forming a multichip module is disclosed. Particularly, a plurality of semiconductor dice may be provided and may be assembled in a stacked relationship. At least one conductive via, including a plurality of conductive elements according to the present invention, may be formed through each of the plurality of semiconductor dice. Optionally, subsequent to assembling the plurality of semiconductor dice in a stacked relationship, at least one conductive via, including a plurality of conductive elements, may be formed through some or all of the plurality of semiconductor dice.

In addition, the present invention encompasses a system, including at least one semiconductor die, having a via including a plurality of conductive elements according to the present invention, and optionally including a multichip module including a plurality of such semiconductor dice. The at least one multichip module may comprise a plurality of semiconductor dice assembled in a stacked arrangement, each of the plurality of semiconductor dice including at least one via having a plurality of conductive elements according to the present invention extending therethrough, wherein at least one conductive element of the plurality of conductive elements extending through the at least one via formed through each of the plurality of semiconductor dice is electrically communicative with at least one bond pad thereof, respectively.

The present invention further encompasses a semiconductor die including a substrate including an active surface having a plurality of bond pads formed thereon and a generally opposing back surface. In addition, the substrate may include at least one multiconductor via including a plurality of conductive elements extending therethrough, wherein each of the conductive elements of the at least one multiconductor via is electrically connected to a different bond pad of the plurality of bond pads, respectively.

Also, the present invention contemplates a substrate, including a through-hole extending between a first surface and a second surface of the substrate, wherein a dielectric material substantially fills the through-hole. Also, a plurality of smaller through-holes may be formed through the dielectric material, extending between the first surface and the second surface and conductive material may be disposed within each of the smaller plurality of through-holes forming a conductive element extending through each of the smaller plurality of through-holes, respectively.

In addition, the present invention encompasses a semiconductor die, including a substrate including an active surface having a plurality of bond pads formed thereon and a generally opposing back surface. In addition, the substrate may include at least one multiconductor via, including a plurality of conductive elements, wherein each of the conductive elements of each of the at least one multiconductor via may be electrically connected to a separate region of a patterned bond pad of the plurality of bond pads, respectively.

As a further contemplation of the present invention, a substrate may include a through-hole extending between a first surface and a second surface of the substrate. Also, a plurality of laterally separated conductive elements may extend within the through-hole and dielectric material may be disposed between the plurality of conductive elements for electrical isolation of each thereof, respectively.

Other features and advantages of the present invention will become apparent to those of skill in the art through consideration of the ensuing description, the accompanying drawings, and the appended claims.

BRIEF DESCRIPTION OF THE SEVERAL
VIEWS OF THE DRAWINGS

DETAILED DESCRIPTION OF THE INVENTION

Generally, the present invention relates to a substrate having at least one via extending between a first surface and a second surface thereof, wherein the conductive via included a plurality of conductive elements extending therethrough.

In the following detailed description, reference is made to the accompanying drawings hereof, which illustrate specific embodiments in accordance with the present invention. It should be understood that other embodiments may be utilized, and that various structural, process, or structural and process changes may be made to the described embodiments of the present invention without departing from the spirit and scope thereof. In addition, for clarity, like numerals may refer to like elements and functions in the various figures of the drawings and illustrating different embodiments of the present invention.

Exemplary embodiments of methods of manufacture of a conductive via according to the present invention will be described with reference to FIGS. 1A-1B, 2A-2C, 3A-3E, and 4A-4D.

Figure 1A:
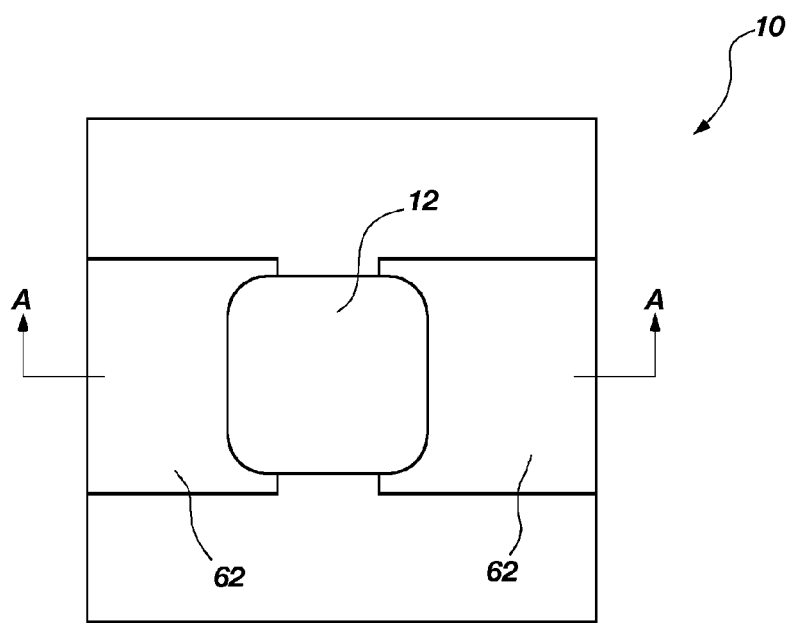
FIG. 1A is a top elevation view of a substrate including a through-hole.
Figure 1B:
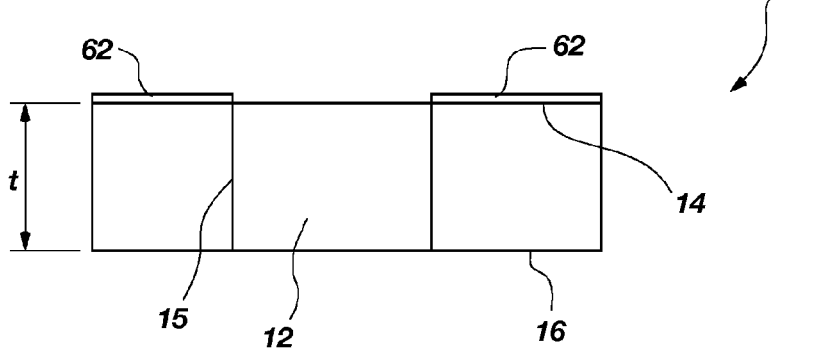
FIG. 1B is a side cross-sectional view of the substrate shown in FIG. 1A, taken along reference line A-A.

Referring to FIGS. 1A and 1B, a substrate 10 according to the present invention is shown in a partial top elevation view and a partial side cross-sectional view taken along reference line A-A (FIG. 1A). As discussed in further detail herein, the substrate 10 may comprise a semiconductor substrate, such as a silicon wafer. Alternatively, the substrate 10 may comprise geranium, gallium arsenide, indium phosphide, silicon-on-glass, silicon-on-sapphire, a ceramic, a polymer, a glass-filled epoxy resin material, or any other known substrate material. The substrate 10 may be rigid or flexible. Additionally, a substrate as described hereinbelow may comprise any of the above-mentioned materials or attributes, without limitation.

As shown in FIG. 1A, a through-hole or aperture 12 may be formed to extend between a first surface 14 and a second, opposing surface 16 of the substrate 10. At least one conductive trace 62 may be formed generally upon, along, or superimposed with at least one of first and second surfaces 14 and 16 thereof. More specifically, as shown in FIGS. 1A and 1B, the at least one conductive trace 62 may be formed upon the surface 14 of substrate 10 prior to the formation of through-hole 12. Further, at least a portion of the at least one conductive trace 62 may form a portion of sidewall 15 of the through-hole 12. Such a configuration may result if the at least one conductive trace 62 is formed upon first surface 14 and through-hole 12 is formed subsequently through at least a portion thereof.

Through-hole 12 may be formed within substrate 10 through a variety of techniques, as described below. For instance, through-hole 12 may be formed by removing at least a portion of the substrate via an etching process. Generally, the present invention contemplates that etching processes as known in the art may be employed, such as, for instance, wet etching (anisotropic or isotropic) or dry etching (generally anisotropic) may be employed by the present invention. More specifically, by way of example and not by limitation, plasma etching, ion beam etching, ion beam milling, reactive ion beam etching, chemical dry etching, chemical etching in a plasma, chemical-physical etching, or chemical wet etching may be employed for forming through-hole 12. Of course, the etching process and materials may be selected and tailored according to the material within which the through-hole 12 is to be formed (e.g., the material of substrate 10).

For instance, a resist may be formed over at least a portion of a surface to be etched. The resist may comprise a conventional positive or negative photoresist, wherein photosensitive film is coated over a surface, selectively exposed through a mask, photochemically developed to fix or cure a portion thereof, and the remainder removed. Wet etching may be commonly used for forming a desired topography in a silicon material, wherein a typical etchant may include hydrofluoric acid, ammonium fluoride, or a mixture thereof. Alternatively, a typical dry etching process may utilize fluorine atoms (e.g., generated in a discharge of nitrogen trifluoride) to etch silicon. It may be appreciated that many different etchant variations and process environments are known in the art for etching a substrate of a given material or multiple layers of materials.

Accordingly, a resist and etch process may be performed wherein a resist layer (not shown) may be formed over a portion of the first surface 14 (or second, opposing surface 16) of substrate 10 to define an exposed portion of substrate 10 surrounded by resist material, and the through-hole 12 may be etched through substrate 10. Subsequent to etching, the resist layer (not shown) may be removed (stripped). Etching through-hole 12 through substrate 10 may cause the sidewalls 15 defining through-hole 12 to exhibit a taper (not shown). Such behavior may be predictable or alterable based on the material comprising the substrate 10, its crystallographic orientation (if applicable), the thickness, labeled "t" in FIG. 1B thereof, the type of etching performed, or other characteristics that influence the process. Therefore, the dimensions of the through-hole 12 may be controllable, predictable, or both.

Alternatively, through-hole 12 may be formed by way of laser ablation (i.e., exposure to directed energy in the form of a laser beam). Explaining further, as known in the art, a laser beam may be directed toward the first surface 14 of substrate 10, to ablate portions thereof to form a through-hole 12 having selected dimensions. The sidewalls 15 of through-hole 12 may exhibit a slight taper (not shown). Such characteristics may be predictable or alterable and, therefore, may be considered with respect to the dimensions of through-hole 12. If a laser beam is employed to form through-hole 12 in, for example, a silicon substrate such as a semiconductor wafer, a heat-damaged area of the substrate (commonly termed the "heat affected zone," or "HAZ") may be removed by etching using a 6% tetramethyl ammonium hydroxide (TMAH) in propylene glycol solution, which may cause a laser-ablated, rounded through-hole to tend toward a rectangular cross-section upon removal of the HAZ. Notably, the aforementioned TMAH solution does not damage any metallization which may be present on the substrate, Alternatively, a HAZ may be treated to provide a suitable site for deposition by treatment with a dilute caustic, such as 1-2% NaOH or KOH, solution.

As yet another alternative, through-hole 12 may be formed by drilling and, optionally, routing, if the lateral dimension of the through-hole 12 is to be sufficiently large to permit use of such techniques. The particular technique or techniques used for forming through-hole 12 are not limiting of the scope of the present invention.

In another aspect of the present invention, through-hole 12 may be formed by way of trepanning, which, as used herein, refers to a process by which a larger hole is formed by way of removing a relatively small portion of the substrate along a desired periphery of the larger hole. For instance, a multitude of smaller holes may be formed along a desired periphery of the larger hole. Of course, it will be appreciated that etching, photo-ablating, laser ablating, or other material removal methods as known in the art may be employed in the process of trepanning, without limitation.

Figure 2A:
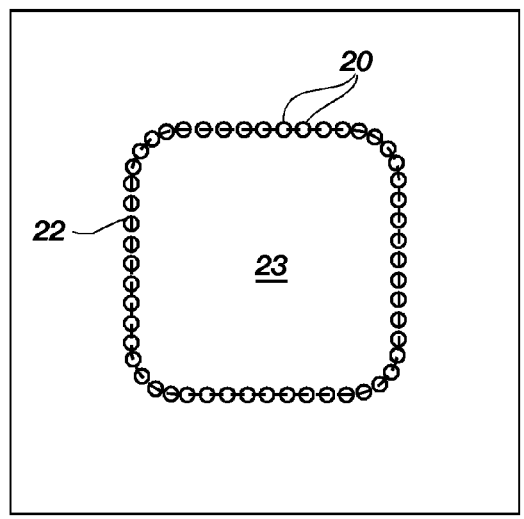
FIG. 2A is a partial schematic top elevation view of a substrate, showing a multitude of relatively small through-holes disposed along a periphery of an intended larger through-hole.
Figure 2B:
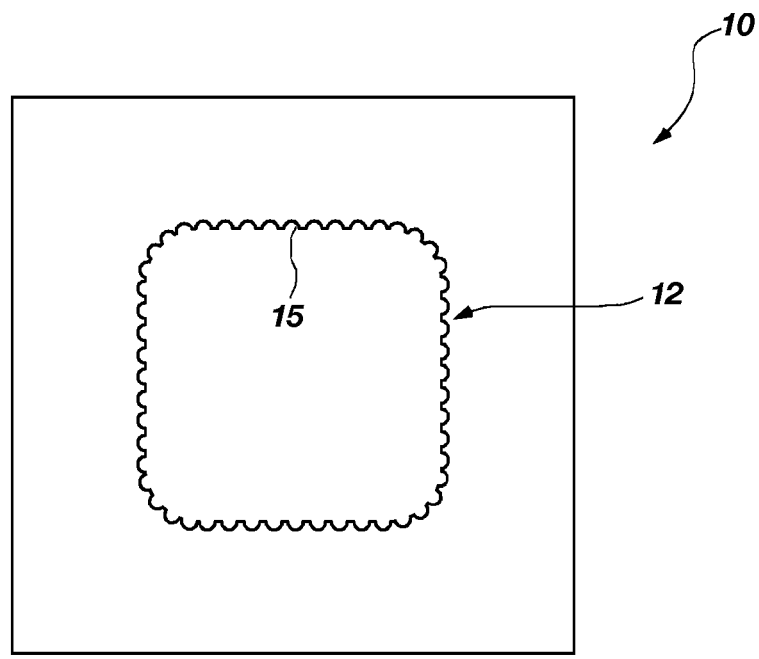
FIG. 2B is a schematic top elevation view of the larger hole formed in the substrate from the multitude of relatively small through-holes shown in FIG. 2A.

In further detail, referring to FIG. 2A showing substrate 10 in a partial schematic top elevation view, a multitude of holes 20 may be formed through substrate 10 and arranged along a periphery 22 of a closed plane figure defining a desired larger through-hole may be laser ablated or etched. The multitude of holes 20 may be interconnected, so that, upon forming the last of the multitude of holes 20, the core or central region 23 within the periphery 22 of a closed plane figure may become completely disconnected and removed from the substrate 10. Alternatively, at least two of the multitude of holes 20 may be adjacent one another, but not interconnected, thus leaving a portion of the substrate 10 therebetween as shown in FIG. 2A. In such a configuration, the core 23 within the periphery 22 of the closed plane figure may be removed by removing or failing the remaining portion of substrate 10 between the at least two adjacent holes of the multitude of holes 20, as shown in FIG. 2B showing a top elevation view of the through-hole 12 formed by the multitude of holes 20 shown in FIG. 2A.

For instance, a force may be applied to the core 23 to mechanically fail the remaining portion of substrate 10 between the at least two adjacent holes of the multitude of holes 20. Alternatively, the entire substrate 10 may be etched (e.g., wet chemical etching) to remove the remaining portion of the substrate 10 between the at least two adjacent holes of the multitude of holes 20. Accordingly, a first etch process, for instance, an anisotropic etch process, may be used to form the multitude of holes 20 and a second etch process, for instance, an isotropic etch process, may be employed to remove the remaining portion of the substrate 10 between the at least two adjacent holes of the multitude of holes 20. After the core 23 has been removed, as shown in FIG. 2B, the sidewalls 15 of the through-hole 12 may be uneven. Accordingly, an etching process (e.g., wet chemical etching) may be used to smooth the sidewalls of the through-hole 12.

Figure 2C:
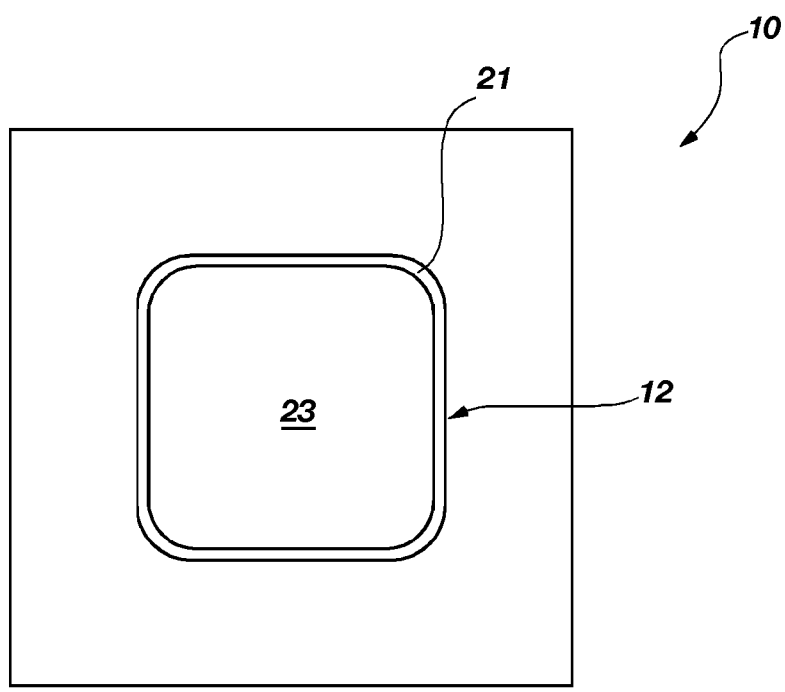
FIG. 2C is a schematic top elevation view of a through-hole formed in a substrate by forming a substantially continuous perforation.

It should be appreciated that trepanning also encompasses removing a substantially continuous peripheral perforation 21 from the substrate 10 generally about a desired periphery of a through-hole 12, as shown in FIG. 2C. For instance, a through-hole 12 may be formed by laser ablating a substantially continuous peripheral perforation 21 or "cut" along a desired periphery of the through-hole 12. The core or central region 23 may become completely disconnected and removed from the substrate 10 subsequent to formation of the periphery of through-hole 12.

The shape of through-hole 12 may be generally square, as shown in FIGS. 1A and 2A. Alternatively, through-hole 12 may be generally circular, generally rectangular, generally triangular, generally oval, generally polygonal, or as otherwise desired or known in the art. Also, after forming a through-hole 12, the sidewall 15 of through-hole 12 extending through substrate 10 may be cleaned by way of a wet etching process or other cleaning process as known in the art. For instance, it may be desirable to remove any substrate material affected by heat, for instance, if the through-hole 12 is formed by a laser ablation process, as noted above.

For clarity and ease of reference, through-hole 12 is shown in a schematic top elevation view in FIGS. 3A-3D, without depicting a substrate or a conductive trace. However, it should be understood that through-hole 12 as shown in FIGS. 3A-3D may be formed within a substrate 10 and may include at least one trace 62, as shown in FIGS. 1A and 1B.

Figure 3A:
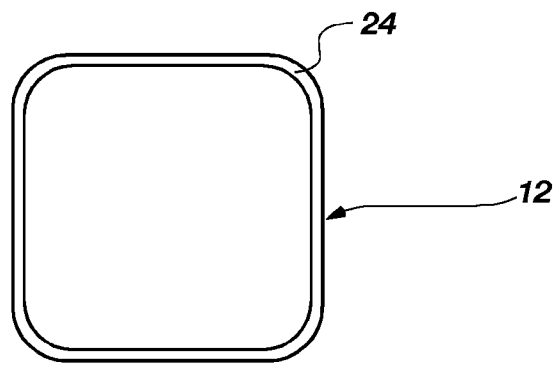
FIG. 3A is a schematic top elevation view of a through-hole formed in a substrate and a passivation layer formed thereon.

Once through-hole 12 is formed, as shown in FIG. 3A, a dielectric layer 24 may be formed upon the interior thereof. For instance, the inner surface of through-hole 12 may be passivated or coated by forming a dielectric layer 24 comprising a dielectric or insulative material suitable for the type of material comprising substrate 10 upon an inner surface of through-hole 12. For example, the dielectric layer 24 may comprise spin-on-glass, thermal oxide, PARYLENE™ polymer, low silane oxide (LSO), a pulse deposition layer comprising aluminum-rich oxide, silicon dioxide, silicon nitride, silicon oxynitride, a glass (i.e., borophosphosilicate glass, phosphosilicate glass, or borosilicate glass), or any dielectric material having a low dielectric constant known in the art. To accomplish the passivation, the dielectric layer 24 may be deposited to any desired thickness using any known process including, without limitation, physical vapor deposition (PVD), atomic layer deposition (ALD), chemical vapor deposition (CVD), low pressure chemical vapor deposition (LPCVD), rapid thermal nitridation (RTN), a spin-on-glass (SOG) process, flow coating or any other known process. In other embodiments, the dielectric layer 24 may comprise an insulating polymer, such as BT resin, polyimide, benzocyclobutene or polybenzoxazole deposited using an injection process, a capillary process, or a vacuum-draw process. The dielectric layer 24 may be, for example, of about 1 μm to 5 μm in thickness. Optionally, for instance, if the substrate 10 comprises an electrically insulating (dielectric) material, such as selected ceramics, or is otherwise electrically insulated, the dielectric layer 24 may be omitted.

Figure 3B:
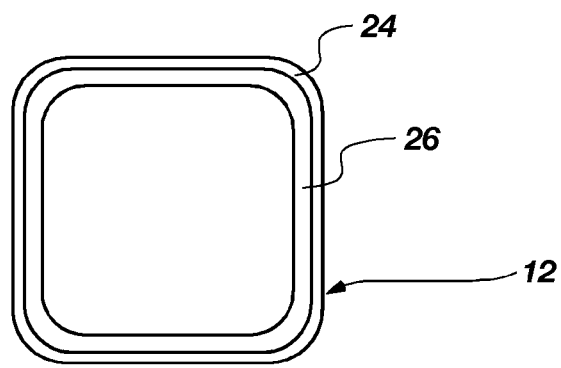
FIG. 3B is a schematic top elevation view of the through-hole shown in FIG. 3A, including a seed layer formed upon the passivation layer.

Further, as shown in FIG. 3B, a seed layer 26 of a material configured for promoting metal formation in response to a subsequent electroplating process or electroless plating process may be deposited over the dielectric layer 24. Regarding electroless plating, a seed layer 26 may be typically formed by, for example, plasma-enhanced chemical vapor deposition (PECVD). The seed layer may be subsequently coated by a metal layer by placing the substrate in a bath that contains metal ions in aqueous solution and a chemical reducing agent such that the metal ions are deposited on the seed layer by a chemical reduction process. In electroplating, metal, in ionic form in a solution, is deposited on a substrate immersed therein. A current is passed from an anode through the electroplating solution such that the metal ions are deposited on the cathode provided by a seed layer of a metal surface of the substrate. A seed layer for an electroplating process may also be formed by chemical vapor deposition (CVD) or physical vapor deposition (PVD), or as otherwise known in the art.

Thus, for instance, the seed layer 26 may comprise titanium nitride (TiN) and may be deposited by CVD, PVD, atomic layer deposition (ALD), PECVD, vacuum evaporation, sputtering, or other deposition processes as known in the art. Other materials that may comprise the seed layer 26 include, without limitation, titanium (Ti), silicon nitride ($Si_3N_4$), a polysilicon, tantalum nitride (TaN), copper, tungsten, tantalum, rhodium, ruthenium, nickel, silver, gold, combinations or alloys thereof, or other material as known in the art, without limitation. It will be appreciated by one of ordinary skill in the art that the selection of the type of material and deposition process utilized to deposit the seed layer 26 may vary depending on the type of material that is intended to be used to form the electrical interconnections (i.e., conductive elements) extending through the through-hole 12.

Figure 3C:
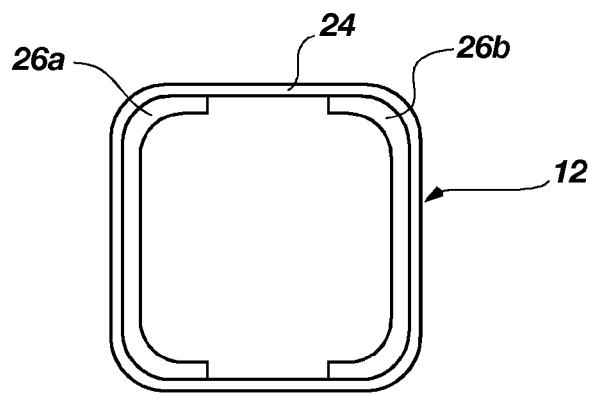
FIG. 3C is a schematic top elevation view of the through-hole shown in FIG. 3B, wherein the seed layer has been patterned.

According to the present invention, subsequent to deposition of the seed layer 26, the seed layer 26 may be patterned, as shown in FIG. 3C. For instance, separated seed layer regions 26a and 26b may be formed by exposing the seed layer 26 to a laser beam. Selectively exposing seed layer 26 to a laser beam may effectively remove at least a portion of the seed layer 26 from a corresponding portion of the through-hole 12, so that metal will not be formed thereon in a subsequent plating process (e.g., an electroplating or electroless plating process). After patterning the seed layer 26 by way of exposing at least a portion thereof to a laser beam, the through-hole 12 may be cleaned via a wet etching process or other cleaning process as known in the art. For Instance, it may be desirable to remove a portion of seed layer 26 material or substrate 10, which is undesirably affected by heating due to patterning of the seed layer 26, by exposure to a laser beam.

Alternatively, seed layer 26 may be patterned by a photo-resist and etch process. For instance, the resist may comprise a photo-resist, wherein a photosensitive film (i.e., a photo-polymer) is coated over a surface of seed layer 26, selectively exposed through a mask and photochemically fixed or cured thereon. For instance, Rohm and Haas Electronic Materials (formerly Shipley Company) of Marlborough, Mass., commercially manufactures photoresist chemicals suitable for patterning a seed layer 26. Wet etching selective for the material of seed layer 26 may be commonly used subsequent to the application of the resist for removing the exposed portion of seed layer 26. Alternatively, a conventional dry etching process may utilize fluorine atoms (e.g., generated in a discharge of nitrogen trifluoride) to etch away at least a portion of the seed layer 26. It may be appreciated that many different etchant variations and process environments are known in the art for etching at least a portion of seed layer 26 of a given material or materials. Subsequent to etching at least a portion of seed layer 26, the resist layer (not shown) may be removed (stripped) therefrom.

In addition, an electrophoretic resist may be formed over seed layer 26. Electrophoretic deposition may be accomplished using any conventional electrophoretic technique known now, or in the future, to those of ordinary skill in the art. For example, the substrate 10 may be placed in an electrophoretic bath and an electric current then applied through the substrate 10. For example, the electrophoretic bath may comprise a cataphoretic resist emulsion, wherein an ionized polymer forms positively charged micelles comprising solvent, dye, and photoinitiator molecules, which may be in the 50-200 nm range. For example, Rohm and Haas Electronic Materials (formerly Shipley Company) of Marlborough, Mass. commercially manufactures chemicals suitable for forming an electrophoretic resist over seed layer 26.

Accordingly, the substrate 10 may be exposed (e.g., by immersion, dipping, etc.) in an electrophoretic bath solution. The electrophoretic bath solution may be any suitable fluid with micelles suspended therein. Any fluid (whether liquid or gaseous) capable of suspending the micelles therein and allowing the micelles to be electrodeposited therefrom may be used.

When an electric field is applied, micelles migrate by electrophoresis towards the cathode (substrate 10). The conductivity of the electrophoretic bath solution may be formulated to permit controlled electrolysis, and when the micelles reach the cathode, their positive surface charges may be neutralized by hydroxide ions produced by the electrolysis of water. The micelles then become destabilized and coalesce on the surface of the cathode to form a self-limiting, insulating film. One embodiment of such an interaction would be the attachment of a positively charged amine functional group to a bare silicon sidewall of through-hole 12 extending at least partially through a silicon substrate 10.

If substrate 10 is conductive, such as P-type substrates, the electric current may be applied directly through the substrate 10. Further, as the surface of the through-hole 12 is covered by micelles deposited thereon, the micelles coalesce to form a layer of resist material. In embodiments where the resist material is electrically insulating, the deposition may be self-limiting, ceasing once the through-hole 12 is uniformly covered therewith, resulting in a relatively uniform thickness of the resist material. Such a configuration and process may be advantageous because the micelles are only deposited on the exposed, electrically conducting portions of the substrate 10, such as the sidewall of the through-hole 12. Other surfaces of substrate 10 may be provided with nonconductive coatings and will not be deposited upon as no micelles will be drawn thereto.

Once the resist layer has been deposited, it may be developed by exposure to a laser beam. Thus, selected regions of the resist layer may be developed, and undeveloped regions may be stripped. Then the exposed regions of the seed layer 26 may be removed, as by etching. Of course, the resist layer may be stripped after patterning of the seed layer 26.

Figure 3D:
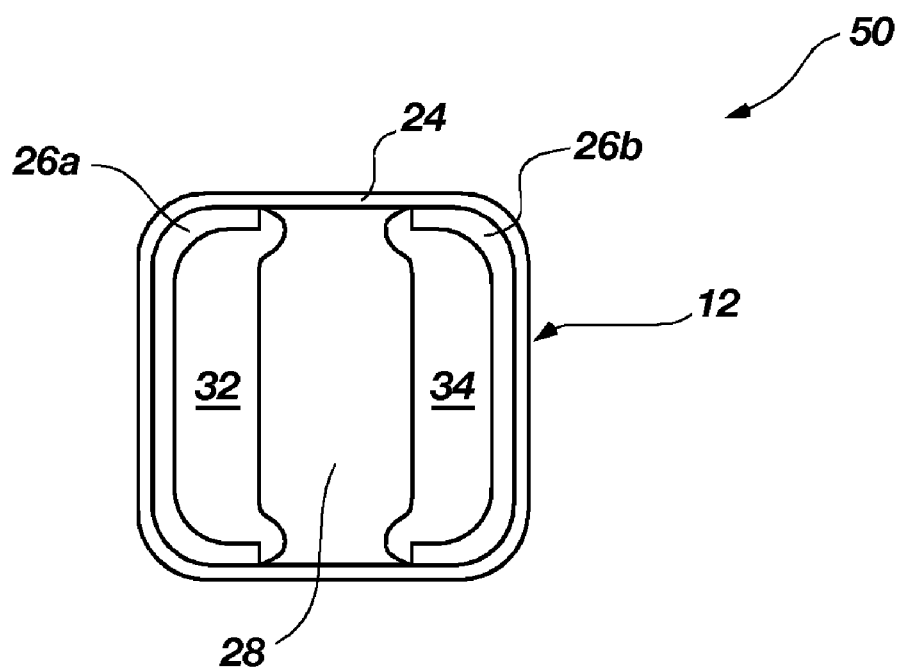
FIG. 3D is a schematic top elevation view of the through-hole shown in FIG. 3C, wherein conductive elements have been formed upon the patterned seed layer.

As shown in FIG. 3D, once the seed layer 26 has been patterned, the remaining portions of seed layer 26 may be plated with a metal, such as copper, to form a plurality of conductive elements 32 and 34 extending through the through-hole 12, forming via 50. Alternatively, a metal, such as copper, may be deposited upon the patterned seed layer by way of, for instance, physical vapor deposition (PVD). More generally, the metal deposited upon the patterned seed layer may comprise copper, silver, gold, nickel, or cobalt. As known in the art, the seed layer may also include a barrier layer to prevent metal subsequently deposited thereon from migrating into the substrate 10. The barrier layer (not shown) may comprise TaN, W, or other materials as known in the art, without limitation. Thus, substrate 10 may include at least one via 50 comprising a plurality of conductive elements 32 and 34 extending therethrough, separated by gap region 28.

Patterning the seed layer 26 prior to plating thereof may be advantageous. Particularly, conventional plating methods may plate metal upon a non-patterned seed layer without patterning and then separate or "split" the plating and conventional, non-patterned seed layer into separated conductive elements. In contrast, in accordance with the present invention, by patterning the seed layer 26 prior to plating thereof, plated metal which would have been later removed and the time for removal thereof may be saved. Thus, a cost savings in materials and a time savings may be realized by employing the methods of the present invention.

Figure 3E:
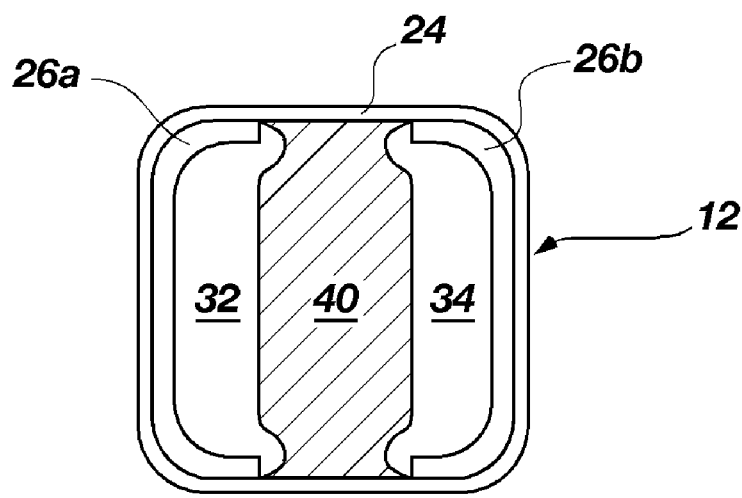
FIG. 3E is a top elevation view of the through-hole shown in FIG. 3D, including a dielectric material deposited between the conductive elements.

After plating the separated regions 26a and 26b of seed layer 26, the gap region 28 extending therebetween may be substantially filled with a dielectric material 40, such as an epoxy, as shown in FIG. 3E. Alternatively, dielectric material 40 may comprise an insulating polymer, a ceramic paste, a BT resin, a polyimide, a benzocyclobutene, or a polybenzoxazole. Such a configuration may inhibit electrical communication between the conductive elements 32 and 34 or may inhibit contamination thereof. Thus, as shown in FIG. 3E, a via 50 according to the present invention may include conductive elements 32 and 34 extending therethrough. Further, each of conductive elements 32 and 34 may be electrically communicative with at least one trace 62 formed upon substrate 10, as shown in FIGS. 1A and 1B. In a further alternative, filling between conductive elements 32 and 34 may not be necessary and therefore, may be omitted.

Of course, it may be appreciated that the relative size and electrical properties of conductive elements 32 and 34 may be selected in relation to the characteristics of the electrical signal that is intended to be communicated therewith. Particularly, if the cross-sectional size of a conductive element is too small, resistance may be created that drops voltage and causes signal errors or may even deleteriously heat the conductive element or conductive traces in communication therewith. Therefore, a size and electrical conductivity of the conductive elements of a multiconductor via may be selected for limiting the heat developed by passing an anticipated maximum electrical current therethrough. Thus, overall, the number and size of conductive elements may depend on the amount of electrical current, and the conductivity of the conductive elements, and the size of the hole in which they are formed.

Figure 4A:
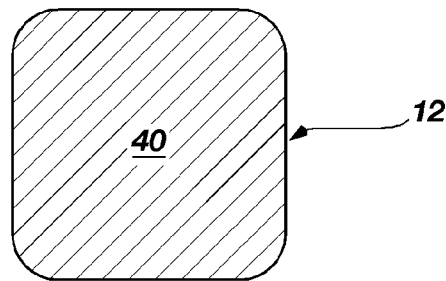
FIG. 4A is a top elevation view of a through-hole formed in a substrate and dielectric material disposed therein.
Figure 4B:
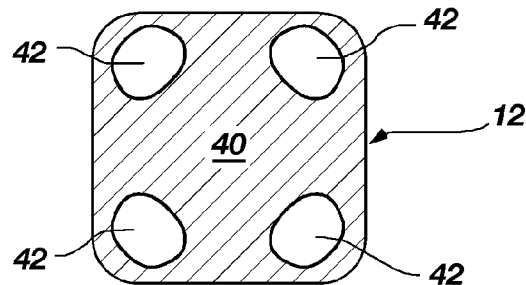
FIG. 4B is a top elevation view of the through-hole shown in FIG. 4A, including a plurality of through-holes formed in the dielectric material.
Figure 4C:
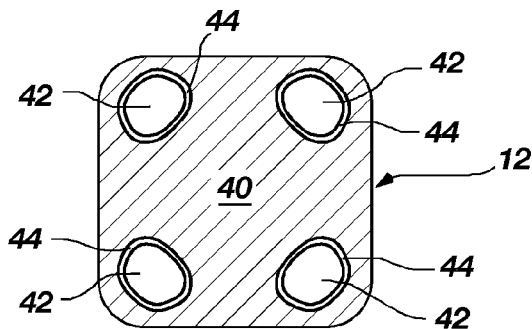
FIG. 4C is a top elevation view of the through-hole shown in FIG. 4B, including a seed layer formed on the interior of each of the plurality of through-holes formed in the dielectric material.

In another exemplary embodiment of a method of the present invention for forming a conductive via, as shown in FIG. 4A, a through-hole 12 may be formed through substrate 10, according to any of the methods as described above, and a layer of dielectric material 40 deposited therein, substantially filling through-hole 12. For clarity and ease of reference, through-hole 12 is shown in a schematic top elevation view in FIGS. 4A-4D, without substrate 10 or at least one trace 62. However, it should be understood that through-hole 12 as shown in FIGS. 4A-4D may refer to the type of through-hole 12 formed within a substrate 10 as shown in FIGS. 1A and 1B, as described hereinabove. As shown in FIG. 4A, dielectric material 40 may substantially fill the through-hole 12. For instance, the dielectric material 40 may comprise an insulating polymer, a ceramic paste, an epoxy, a BT resin, a polyimide, a benzocyclobutene, or a polybenzoxazole deposited using an injection process, a screen-printing process (e.g., by way of a squeegee), a capillary process, or a vacuum-draw process. In addition and as a further alternative, dielectric material 40 may comprise a glass and may be deposited by way of a spin-on-glass process.

Then, through-holes 42 may be formed through the dielectric material 40. For instance, separated through-holes 42 may be formed by laser ablation, photo ablation, etching, or as otherwise known in the art. A seed layer 44 may be formed within each of the plurality of through-holes 42 and a conductive element 46 may be formed within each of the plurality of through-holes 42 by a plating process as described hereinabove with respect to FIGS. 3C and 3D, respectively. For instance, each of seed layers 44 may be plated with a metal, such as copper, to form a conductive element 46 extending within each of the plurality of through-holes 42.

Figure 4D:
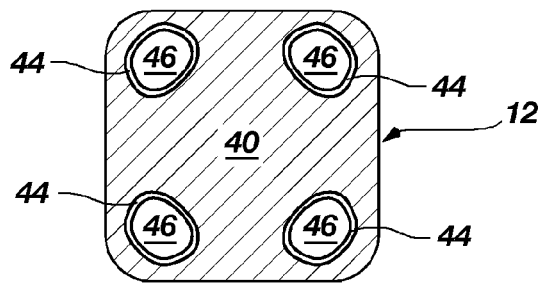
FIG. 4D is a top elevation view of the through-hole shown in FIG. 4C, wherein conductive elements have been formed upon each seed layer of the plurality of through-holes formed in the dielectric material.

Although FIG. 4D shows conductive elements 46 as substantially filling (i.e., solid) the interior of the seed layers 44 of through-holes 42, the present invention is not so limited. Rather, any of conductive elements 46 may comprise a conductive coating or layer that only partially fills its respective through-hole 42, the coating or layer formed on its respective seed layer 44, if necessary. For instance, an activation layer (not shown) and an electroless nickel layer may be formed within each of the plurality of through-holes 42 and each may be filled with a conductive material such as solder. More particularly, a solder paste may be deposited adjacent to the through-holes 42 and reflowed to cause the solder paste to coat the interior of each thereof. Alternatively, any conductive epoxy (e.g., thermally cured, photo-cured, etc.) may be used as known in the art, and may be deposited within through-holes 42 by way of a vacuum-draw process. Further, a tape may be applied to a surface at which through-holes 42 open for containing a conductive epoxy or solder paste generally within through-hole 42, if desired. Epoxy-based materials may be preferable for relatively low temperature applications, while polyimide may be used for relatively higher temperature materials. In another alternative and without prior formation of an activation layer or nickel lining, solder paste may be deposited at least partially within each of through-holes 42 by way of a squeegee process (e.g., screen printing, with a stencil or without) and subsequently reflowed or otherwise heated to form a conductive element 46. In yet another alternative, solder may be deposited within through-holes 42 by way of a wave solder process. Also, alternatively, conductive nanoparticles (e.g., silver nanoparticles) in an organic carrier may be deposited within each of through-holes 42 to form conductive elements 46 at least partially filling each of through-holes 42 after heating of the substrate 10 to drive off the organic carrier.

Figure 5A:
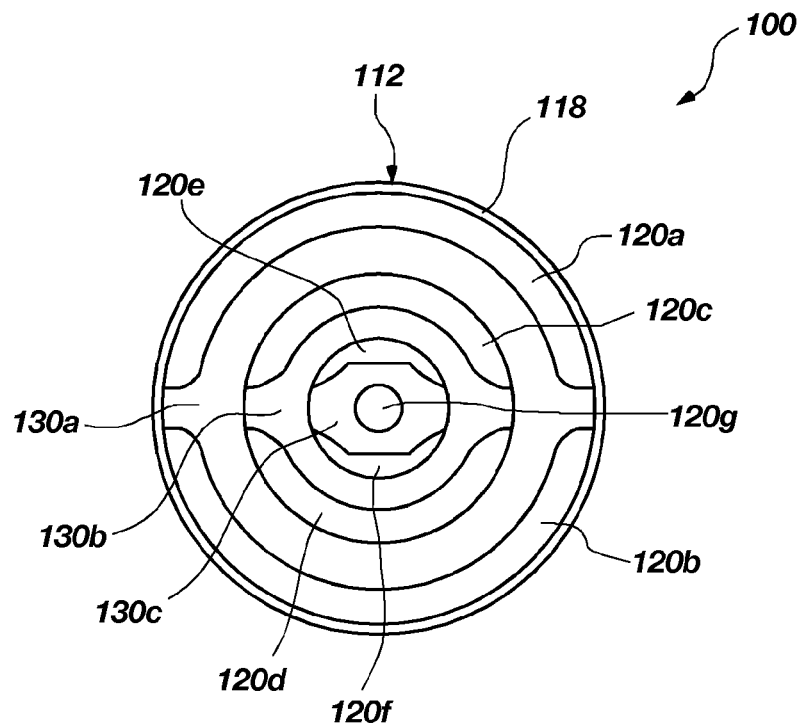
FIG. 5A is a top elevation view of another embodiment of a multiconductor via according to the present invention.

In a further exemplary embodiment of the present invention, a multilayer via may be formed including a plurality of electrically isolated conductive elements within a single through-hole. More particularly, a first plurality of conductive elements may be formed proximate a periphery of the through-hole and at least a second plurality of conductive elements may be formed interiorly with respect to the periphery of the through-hole. For instance, FIG. 5A shows a schematic top elevation view of a via 100 of the present invention including a plurality of conductive elements 120a, 120b, 120c, 120d, 120e, 120f, and 120g disposed therein, separated by dielectric layers 130a, 130b, and 130c, respectively.

Via 100 may be formed according to a process according to the present invention. For instance, a through-hole 112 may be formed (by trepanning or otherwise) and a dielectric layer 118 may be formed therein. A seed layer (not shown) may be formed upon the dielectric layer 118 and patterned thereon, generally corresponding to the areas of conductive elements 120a and 120b. Further, metal may be electrolessly plated or electroplated upon the patterned seed layer (not shown) to form conductive elements 120a and 120b. Then, dielectric layer 130a may be deposited at least over conductive elements 120a and 120b. Dielectric layer 130a may form a coating upon conductive elements 120a and 120b, as shown in FIG. 5A. Alternatively, dielectric layer 130a may initially substantially fill the interior of through-hole 112 between conductive elements 120a and 120b and a through-hole may be formed through the dielectric layer 130a to form the surface upon which conductive elements 120c and 120d are formed.

Then, a seed layer (not shown) may be formed upon the surface of dielectric layer 130a and patterned thereon to form regions of the seed layer generally corresponding to the areas of conductive elements 120c and 120d. Further, metal may be electrolessly plated or electroplated upon patterned seed layer (not shown) to form conductive elements 120c and 120d. Then, dielectric layer 130b may be deposited at least over conductive elements 120a and 120b. Dielectric layer 130b may form a coating upon conductive elements 120c and 120d, as shown in FIG. 5A. Alternatively, dielectric layer 130b may initially substantially fill the interior of through-hole 112 between conductive elements 120c and 120d and a through-hole may be formed through the dielectric layer 130b to form the surface upon which conductive element 120e and 120f are formed.

Additionally, dielectric layer 130c may be deposited at least over the portions of conductive elements 120e and 120f within through-hole 112. Dielectric layer 130c may form a coating upon conductive elements 120e and 120f as shown in FIG. 5A. Alternatively, dielectric layer 130c may initially substantially fill the interior of through-hole 112 between conductive elements 120e and 120f and a through-hole may be formed through the dielectric layer 130c to form the surface upon which conductive element 120e and 120f are formed. Further, a seed layer (not shown) may be formed upon the surface of dielectric layer 130c and a metal may be electrolessly plated or electroplated to form conductive element 120g.

Figure 5B:
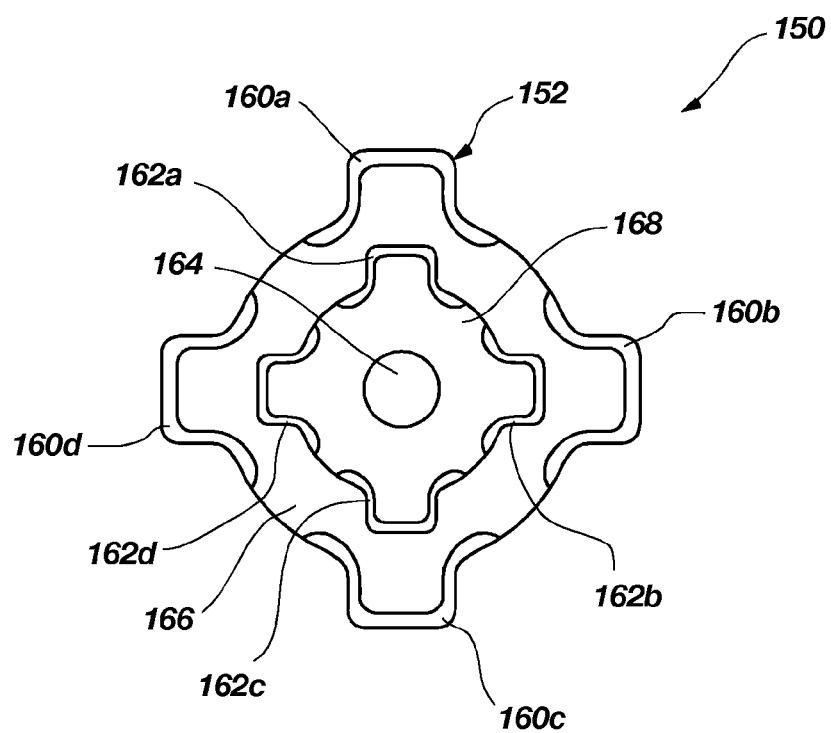
FIG. 5B is a top elevation view of yet a further embodiment of a multiconductor via according to the present invention.

FIG. 5B shows another embodiment of the present invention in a schematic top elevation view of via 150 including a plurality of conductive elements 160a, 160b, 160c, 160d, 162a, 162b, 162c, 162d, and 164 disposed therein, separated by dielectric layers 166 and 168, respectively. Via 150 may be formed in a process of the present invention similar to the above-described process for forming via 100. For instance, a through-hole 152 may be formed and a passivation or dielectric layer (not shown) may be formed therein. A seed layer (not shown) may be formed upon the dielectric layer (not shown) and patterned thereon, generally corresponding to the areas of conductive elements 160a, 160b, 160c, and 160d. Further, metal may be electrolessly plated or electroplated upon the patterned seed layer to form conductive elements 160a, 160b, 160c, and 160d. Then, dielectric layer 166 may be deposited at least over conductive elements 160a, 160b, 160c, and 160d.

Dielectric layer 166 may form a coating upon conductive elements 160a, 160b, 160c, and 160d, as shown in FIG. 5B. Alternatively, dielectric layer 166 may initially substantially fill the interior of through-hole 152 between conductive elements 160a, 160b, 160c, and 160d and a through-hole may be formed within the dielectric layer 166 to form a surface upon which conductive elements 162a, 162b, 162c, and 162d are formed. Then, a seed layer (not shown) may be formed upon a surface of dielectric layer 166 and patterned thereon to form regions of the seed layer generally corresponding to the areas of conductive elements 162a, 162b, 162c, and 162d Further, metal may be electrolessly plated or electroplated upon the patterned seed layer to form conductive elements 162a, 162b, 162c, and 162d. Then, dielectric layer 168 may be deposited substantially between conductive elements 162a, 162b, 162c, and 162d.

Dielectric layer 168 may form a coating upon conductive elements 162a, 162b, 162c, and 162d, as shown in FIG. 5B. Alternatively, dielectric layer 168 may initially substantially fill the interior of through-hole 152 between conductive elements 162a, 162b, 162c, and 162d. Then, a through-hole may be formed through the dielectric layer 168. Also, a seed layer (not shown) may be formed upon the surface of the through-hole formed in dielectric layer 168 and a metal may be electrolessly plated or electroplated upon the hole formed in the dielectric layer 168 to form conductive element 164.

It should be appreciated that conductive elements 160a, 160b, 160c, and 160d (or any other conductive elements described above) may be different from one another in size, shape, materials, or a combination thereof. Of course, depositing different metals to form conductive elements 160a, 160b, 160c, and 160d may require multiple seed layers or different seed layers and patterning thereof. In addition, the present invention contemplates that dielectric layers 166 and 168 (or any other dielectric layers described above) may be configured differently from one another (e.g., size, shape, materials, etc.).

Additionally, it should be appreciated that embodiments of the present invention that are described in terms of forming a through-hole may be accomplished by forming a cavity within a substrate and thinning the substrate to remove the portion of the substrate extending transversely to the cavity.

Figure 5C:
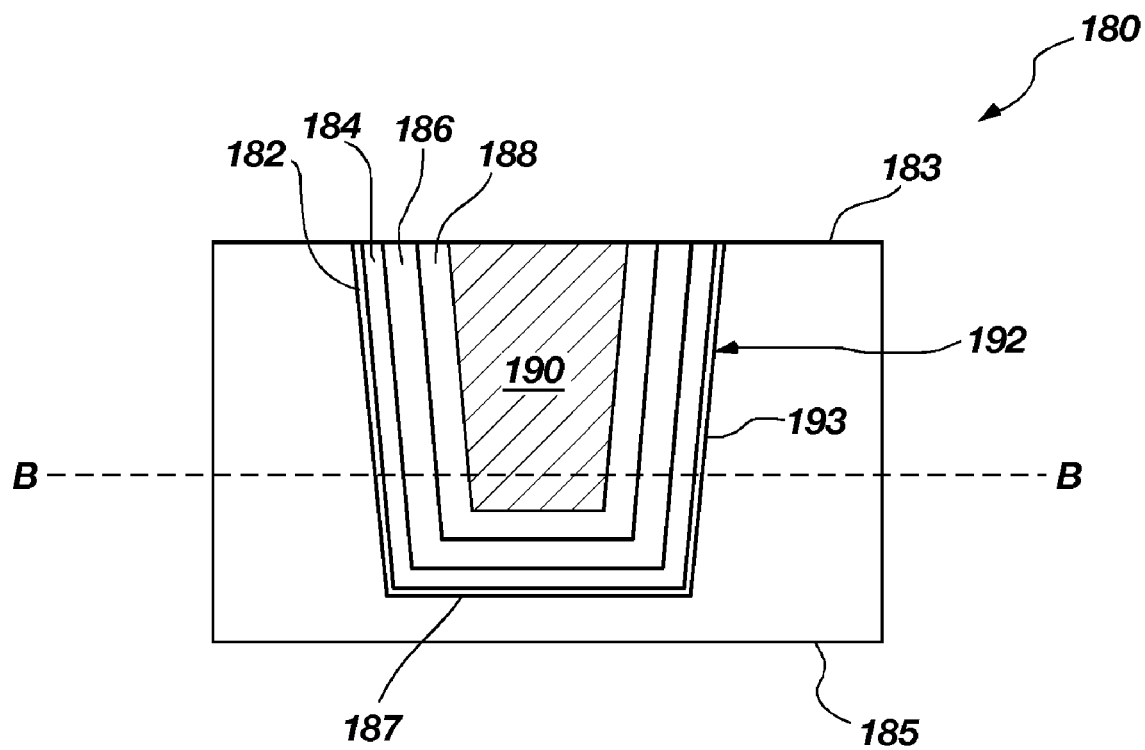
FIG. 5C is a side cross-sectional view of a substrate including a cavity having a plurality of conductive elements formed therein.

Put another way, as used herein, forming a through-hole encompasses forming a cavity in a substrate and thinning away the portion of the substrate extending transversely (i.e., closing) the cavity. For instance, as shown in FIG. 5C, a substrate 180 may be provided having a first surface 183 and a second, opposing surface 185 and a cavity 192 formed into the first surface 183, extending between the first surface 183 and intermediate surface 187. Further, a dielectric layer 182, such as a passivation layer or a dielectric coating, may be deposited or formed within the interior of cavity 192.

Figure 5D:
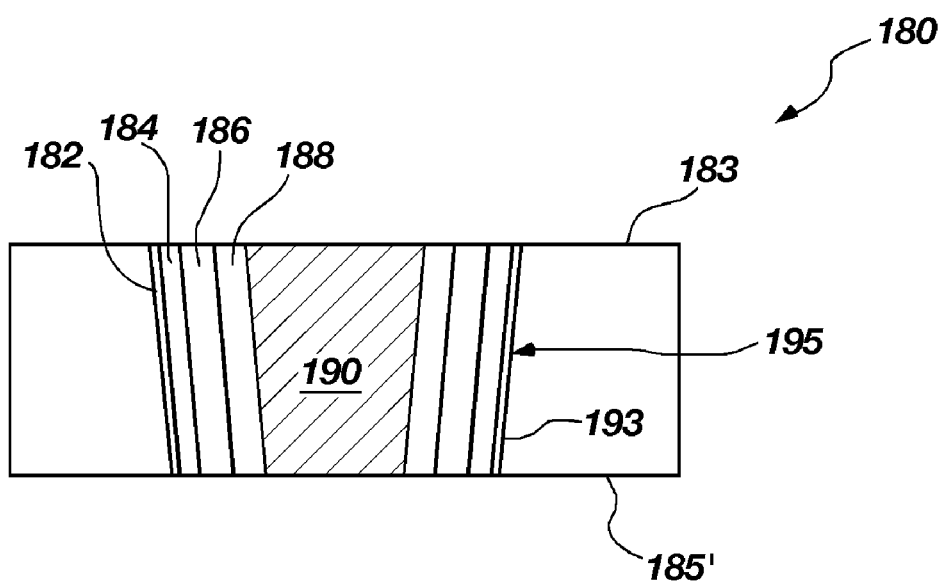
FIG. 5D is a side cross-sectional view of the substrate shown in FIG. 5C, after thinning thereof.

As described in relation to FIGS. 5C and 5D, a seed layer (not shown) may be formed on the dielectric layer 182 and patterned. Further, a plurality of conductive elements (not shown) may be formed by deposition of a conductive layer 184 upon the seed layer on portions of the sidewall 193 of the cavity 192. Also, a dielectric layer 186 may be formed over the conductive layer 184. Then, another seed layer (not shown) may be formed on the dielectric layer 186 and patterned. Subsequently, a plurality of conductive elements (not shown) may be formed by deposition of a conductive layer 188 upon the seed layer on portions of the dielectric layer 186. A dielectric material 190 may be deposited within the interior of conductive layer 188, as shown in FIG. 5C.

Then, the substrate 180 may be thinned (from second, opposing surface 185) to remove at least the portion of the substrate 180 extending between second, opposing surface 185 and intermediate surface 187. Thus, FIG. 5D shows the substrate 180 as shown in FIG. 5C where the region between second surface 185 and reference line B-B (FIG. 5C) has been removed (i.e., thinning substrate 180). Upon removal of the portion of the substrate 180 between second, opposing surface 185 and reference line B-B (FIG. 5C), cavity 192 becomes a through-hole 195 terminating at new, second, opposing surface 185'. Of course, the configuration of the plurality of conductive elements (not shown) extending within through-hole 195 may be as shown in FIGS. 5B, 5C, or as otherwise desired.

In another aspect of the present invention, referring to FIGS. 6A-6D, a plurality of conductive elements may be formed within a cavity 212 extending within a substrate 210 into first surface 214 to intermediate surface 215 lying between first surface 214 and opposing, second surface 216 by employing a patterned resist and a substantially anisotropic etch process.

Alternatively, a Bosch-type etching process may be employed for forming protruding structures 220. Generally, a Bosch-type etching process may comprise alternating etching and passivation forming steps. Explaining further, for example, a Bosch-type etching process may include exposing a silicon substrate (through a patterned resist) to a fluorinated gas (e.g., $SF_6$) in a plasma chamber with a relatively high top power for high etch rates (e.g., greater than about 600 W) and a relatively low bottom power (e.g., about 10 W) to maintain excellent silicon to resist selectivity (e.g., 60:1). After a few seconds, the fluorinated gas may be pumped out of the chamber and a passivation forming gas (e.g., $C_4F_8$) may be introduced therein. A thin passivation layer is formed on the silicon substrate and a fluorinated gas is pumped in again. The fluorine radicals may remove the passivation layer more readily on horizontal surfaces because the ions may be driven vertically. Therefore, a passivation layer formed upon a vertical sidewall (e.g., via a sidewall) may not be substantially influenced, while the passivation layer upon a horizontal surface may be substantially etched by fluorine radicals in the plasma chamber. Hence, the passivation layer may be removed from horizontal surfaces, and etching may continue into the silicon substrate. Further, the passivation forming process may be repeated, intermittently with etching, as desired and etching may continue accordingly.

Figure 6A:
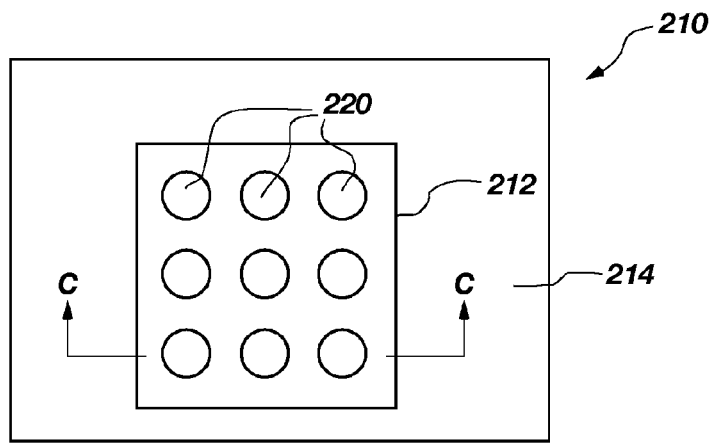
FIG. 6A is a top elevation view of a plurality of protruding structures etched into a substrate within a cavity formed therein.
Figure 6B:
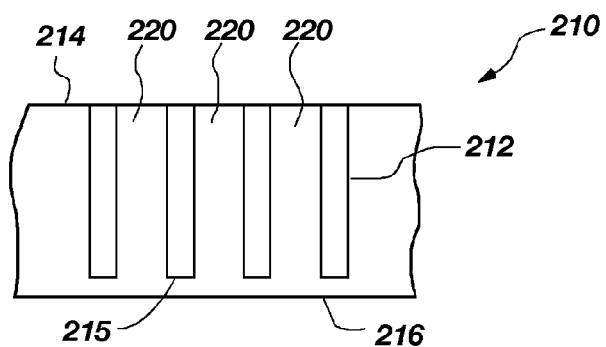
FIG. 6B is a side cross-sectional view of the substrate shown in FIG. 6A, taken along reference line C-C.

FIG. 6A illustrates a top elevation view of cavity 212 including a plurality of protruding structures 220 (e.g., pillars) therein. FIG. 6B is a side cross-sectional view of the substrate 210 shown in FIG. 6A, taken along reference line C-C. In further detail, cavity 212 and protruding structures 220 therein may be formed by first forming a patterned photoresist over a first surface 214 of substrate 210 and etching the substrate 210 in a pattern forming a plurality of protruding structures 220 extending from intermediate surface 215 to first surface 214, as shown in FIG. 6B. Electrophoretic techniques, laser techniques, photo-resist techniques, or other resist forming processes as known in the art and as discussed hereinabove may be employed for forming a resist for forming the plurality of protruding structures 220, without limitation.

In addition or alternatively, processes used for forming atomic force microscopy tips, as known in the art, may be employed for forming protruding structures 220, which may reach atomic dimensions. For instance, mask and etch techniques, such as wet and dry etching (e.g., reactive ion etching), photolithography, nanolithography, CVD processes, or a combination thereof may be used for forming the plurality of protruding structures 220.

In further detail, as known in the art, for example, a common manufacturing technique for forming silicon atomic force microscopy tips may be employed for creating protruding structures 220. First, a circular silicon dioxide dot may be patterned on a silicon substrate (e.g., substrate 210). Subsequently, the silicon may be etched, typically by way of a dry etching process (e.g., reactive ion etching). As the silicon is etched vertically, it may also be etched somewhat laterally under the silicon dioxide dot. The dry-etching process may be terminated just before the silicon has been totally undercut beneath the silicon dioxide dot, then the silicon is oxidized. Some of the silicon is consumed in the oxidation process, so the silicon post becomes a tip after removal of the oxide. Silicon tips may be further processed by a focused ion beam (FIB) to produce tips with a high aspect ratio, if desired. Alternatively, pyramidal silicon atomic force microscopy tips may be formed by anisotropically etching the silicon with an etchant, such as potassium hydroxide, which selectively removes silicon in relation to crystallographic planes of the silicon lattice.

Figure 6C:
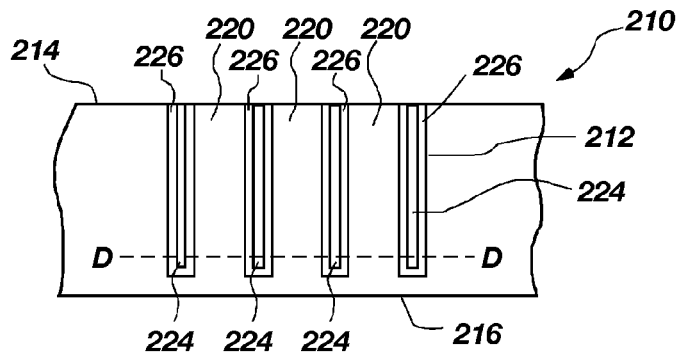
FIG. 6C is a side cross-sectional view of the substrate shown in FIG. 6B, including a conductive layer formed upon each of the plurality of protruding structures and a dielectric layer deposited therearound.

Further, a dielectric or passivation layer (not shown), such as an oxide layer may be formed upon and around the protruding structures 220 and within the cavity 212. Next, a seed layer (not shown) may be formed upon the passivation layer. For example, a seed layer may be electroplated upon the plurality of protruding structures 220 and within the cavity 212. As shown in FIG. 6C, a conductive layer 226, such as a metal layer (e.g., copper) may be formed (e.g., electroplated) upon the protruding structures 220 and within the cavity 212. Also, interstitial spaces formed by conductive layer 226 within cavity 212 may be filled with a dielectric material 224, such as a glass, a polymer, an epoxy, or another electrically insulative material.

Figure 6D:
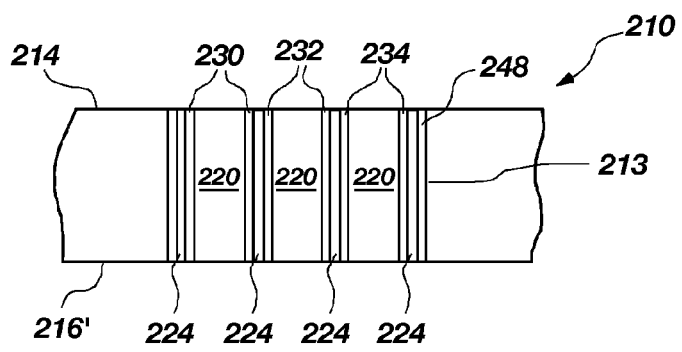
FIG. 6D is a side cross-sectional view of a selectively thinned substrate as shown in FIG. 6C.

Then, the substrate 210 may be thinned, as by abrasive or chemical mechanical planarization from the opposing, second surface 216 to remove at least the portion thereof between intermediate surface 215 from which the protruding structures 220 extend and second surface 216. Thus, FIG. 6D shows the substrate 210 as shown in FIG. 6C where the region between second surface 216 (FIG. 6C) and reference line D-D (FIG. 6C) has been removed (i.e., thinning substrate 210) to result in new, second, opposing surface 216'. Of course, thinning may also be performed upon first surface 214, as desired. Upon removal of the portion of the substrate 210 between second surface 216 (FIG. 6C) and reference line D-D (FIG. 6C), cavity 212 forms a through-hole 213 through substrate 210. Also, upon removal of the portion of the substrate 210 between second surface 216 (FIG. 6C) and reference line D-D (FIG. 6C), a plurality of laterally separated conductive elements is formed from each of the plurality of protruding structures 220 (nine, as shown in FIG. 6A) and about the periphery of the through-hole 213, as discussed hereinbelow.

Figure 6E:
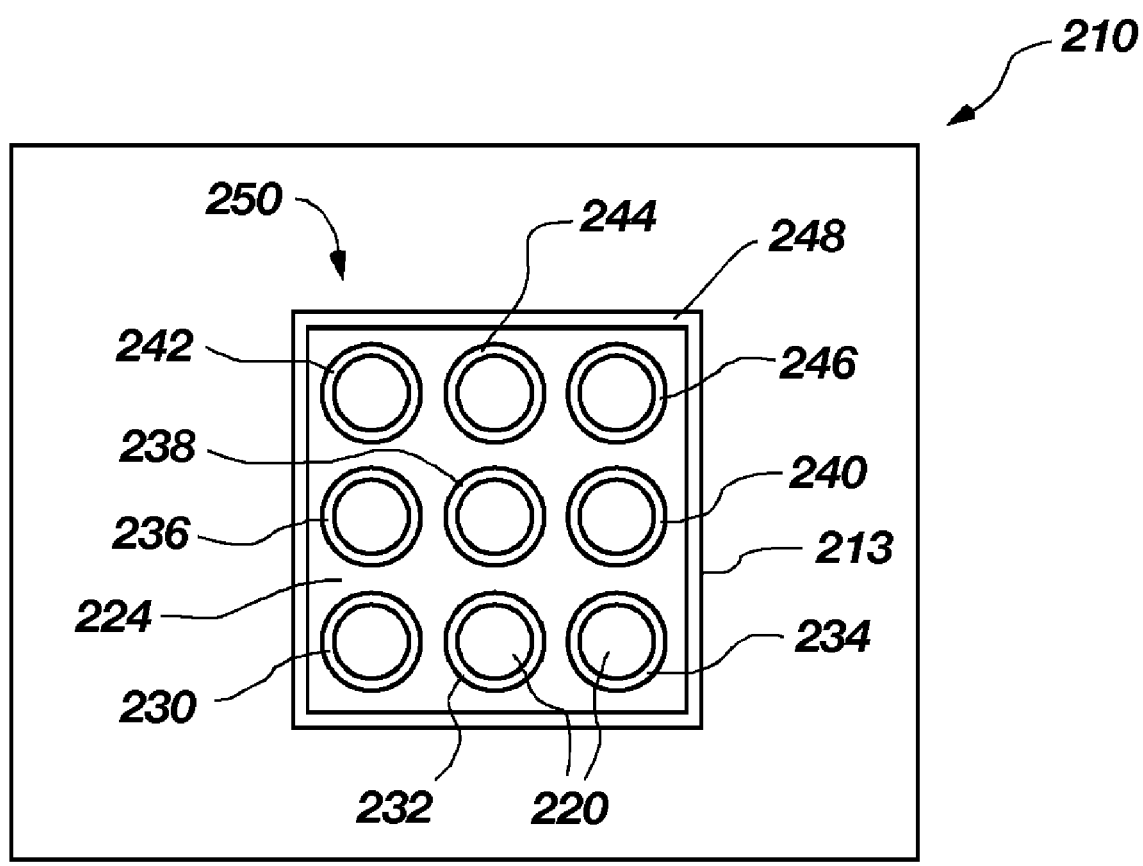
FIG. 6E is a top elevation view of the substrate shown in FIG. 6D.

For instance, as shown in FIG. 6D, conductive elements 230, 232, and 234 correspond with each of the protruding structures 220. Also, conductive element 248, which extends about the periphery of through-hole 213, may also be formed responsive to removal of the portion of the substrate 210 between second surface 216 (FIG. 6C) and reference line D-D (FIG. 6C). Thus, as may be better shown in FIG. 6E, which shows a top elevation view of the substrate shown in FIG. 6D, substrate 210 may include a via 250 having a plurality of, and in this instance ten (10), conductive structures or elements 230, 232, 234, 236, 238, 240, 242, 244, 246, and 248 extending therein.

Figure 7A:
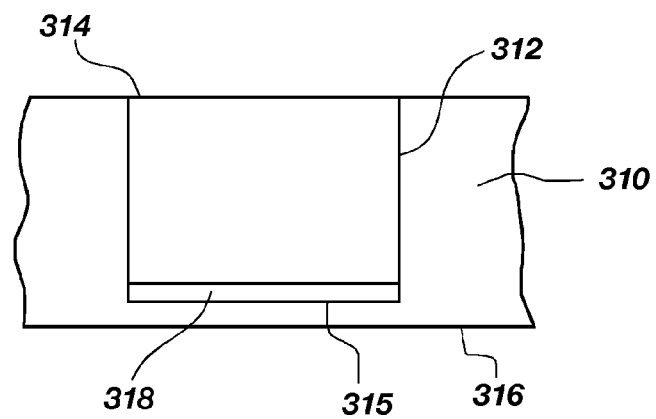
FIG. 7A is a side cross-sectional view of a substrate having a cavity formed therein and a conductive layer formed therein.
Figure 7B:
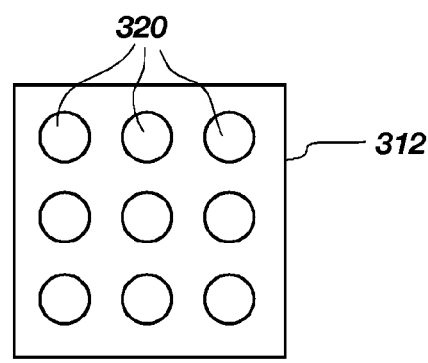
FIG. 7B is a top elevation view of partially formed nanotubes disposed within the cavity shown in FIG. 7A.
Figure 7C:
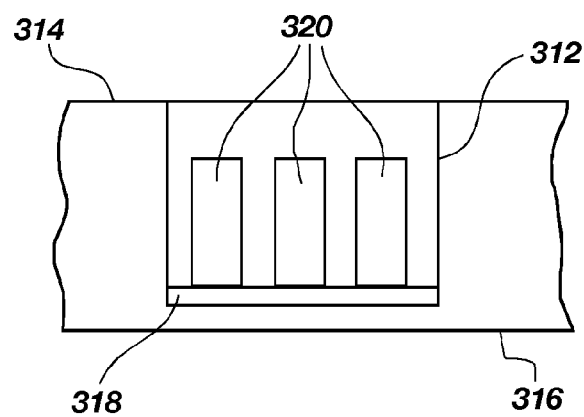
FIG. 7C is a side cross-sectional view of the partially formed nanotubes disposed within the cavity as shown in FIG. 7B.

In another embodiment of the present invention, a plurality of conductive nanotubes may extend through a through-hole, forming a conductive via of the present invention. For example, as shown in FIG. 7A, a cavity 312 may be formed into a first surface 314 of substrate 310 extending to a surface 315 therein and, optionally, a conductive layer 318 layer may be formed thereon. Conductive layer 318 may comprise, for instance, at least one of Tungsten (W), Nickel (Ni), Cobalt (Co), or Iron (Fe), and may be electrolessly plated upon surface 315, or otherwise deposited, without limitation. Further, as shown in FIGS. 7B and 7C, showing a schematic top elevation view and a side cross-sectional view of cavity 312, respectively, conductive nanotubes 320 may be formed upon conductive layer 318 and extending therefrom, toward first surface 314. Conductive layer 318 may be omitted if nanotube formation may be accomplished suitably in its absence. The hollow centers of conductive nanotubes 320 have been omitted in the drawing figures for clarity.

Conductive nanotubes 320 may be formed as known in the art, such as by arc discharge, laser evaporation, or a pyrolysis process. For instance, U.S. Pat. No. 6,720,728 to Den et al., the disclosure of which is incorporated in its entirety by reference herein, discloses methods of forming carbon nanotubes. Carbon nanotubes may be advantageous, because carbon nanotubes may exhibit almost no electrical resistance and, therefore, may be exemplary electrical conductors. Also, U.S. Pat. No. 6,340,822 to Brown et al., the disclosure of which is incorporated in its entirety by reference herein, discloses a method of making a circuit device including a plurality of nanowires, each of the plurality of nanowires having a substantially equal length. As another example, U.S. Pat. No. 6,673,392 to Lee et al., the disclosure of which is incorporated in its entirety by reference herein, discloses a method of vertically aligning pure carbon nanotubes on a large glass or silicon substrate via a catalytic decomposition process. In one example, a nickel catalyst layer may be deposited upon a tungsten pad or interconnect layer and a plurality of conductive nanotubes may be grown thereon, and may be substantially perpendicular or normal to the surface from which they originate, respectively, by the methods described above or as otherwise known in the art, without limitation.

Also, spaces surrounding the conductive nanotubes 320 within cavity 312 may be substantially filled with a dielectric material 324, such as a glass, a polymer, an epoxy, or another insulative material, Then, the substrate 310 may be thinned (from second, opposing surface 316) to remove at least the conductive layer 318 from which the conductive nanotubes 320 extend (i.e., between second surface 316 and conductive layer 318). However, the present invention also contemplates that at least portions of conductive layer 318 may be retained. For instance, if layer 318 electrically matches the conductive nanotubes 320, creating a low resistance junction therebetween, at least a portion of conductive layer 318 may be retained, or otherwise employed for electrical communication through conductive nanotubes 320.

Figure 7D:
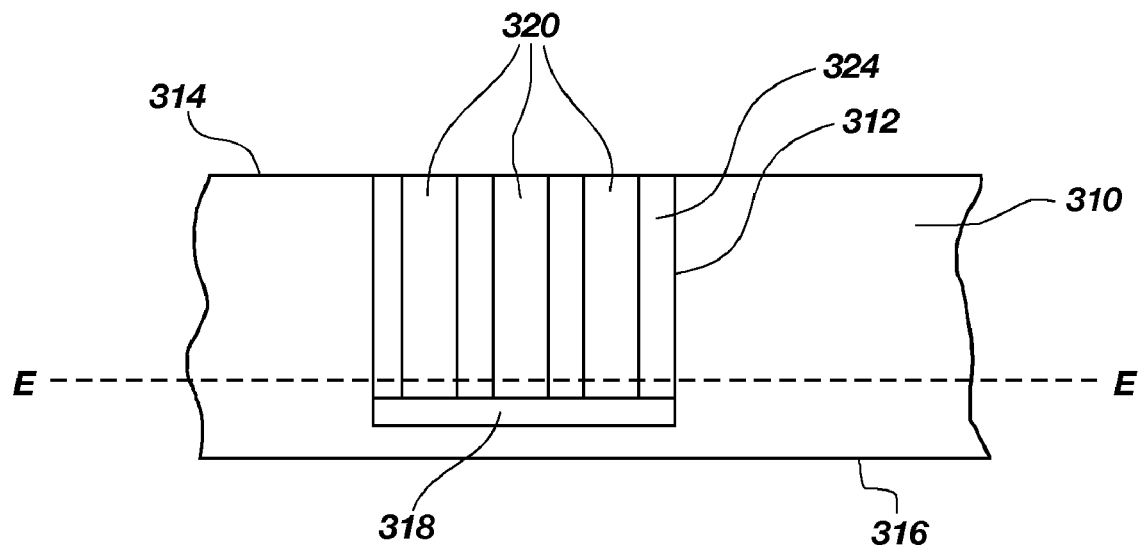
FIG. 7D is a side cross-sectional view of substantially formed nanotubes disposed within the cavity as shown in FIG. 7A.
Figure 7E:
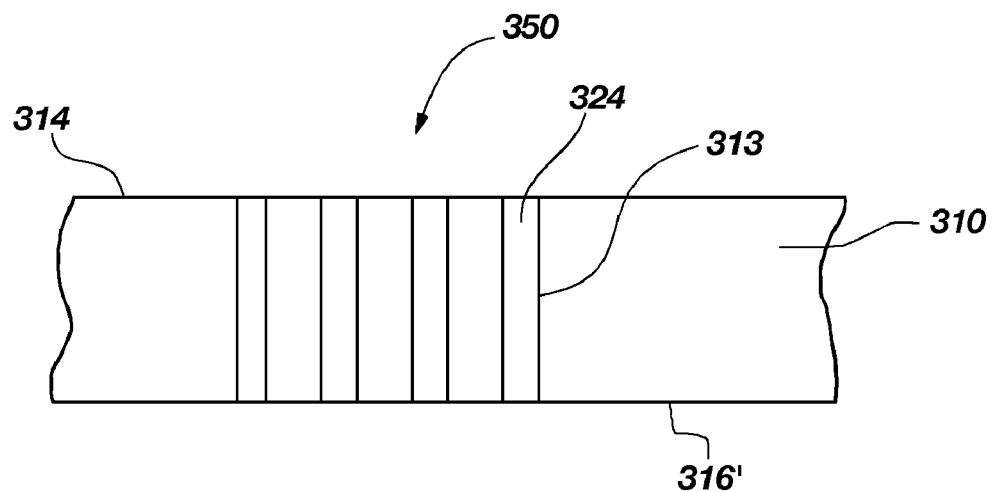
FIG. 7E is a side cross-sectional view of a selectively thinned substrate as shown in FIG. 7D.

Thus, FIG. 7E shows the substrate 310 as shown in FIG. 7D where the region between second surface 316 and reference line E-E (FIG. 7D) has been removed (i.e., thinning substrate 310). Upon removal of the portion of the substrate 310 between second, opposing surface 316 and reference line F-E (FIG. 7D), cavity 312 becomes a through-hole 313 terminating at new, second, opposing surface 316'. Also, upon removal of the portion of the substrate 310 between second surface 316 and reference line E-E (FIG. 7D), conductive elements may comprise each of the conductive nanotubes 320 extending within through-hole 313 and substantially surrounded by dielectric material 324. Thus, via 350 may be formed within substrate 310 having a plurality of conductive nanotubes 320 extending therein. It should be recognized that it may be preferable that each of the plurality of conductive nanotubes 320 be electrically isolated from every other of the plurality of conductive nanotubes 320. However, it should also be appreciated that the present invention encompasses conductive via structures wherein at least some conductive nanotubes 320 of the plurality of conductive nanotubes 320 are electrically conductive or electrically communicate with one another.

Alternatively, if the planarization process is sufficiently precise, the portion of the substrate 310 from surface 316 to surface 315 (FIG. 7A) may be removed, exposing conductive layer 318. Further, conductive layer 318 may then be patterned by a resist and etch process, laser ablation, or as otherwise known in the art. Such a process may eliminate the need for performing additional processes for forming conductive traces or pads in electrical communication with the conductive nanotubes 320.

Of course, the present invention contemplates that conductive traces may be formed for electrical communication with the conductive elements of any of the above-described embodiments of via structures. It should be noted that, where suitable, traces may be formed prior to cavities or through-holes and, therefore, may form at least a portion of a sidewall of a through-hole or cavity. Alternatively, a cavity or through-hole may be formed prior to forming at least one trace for electrical communication with one or more conductive elements of a via structure of the present invention.

Figure 8A:
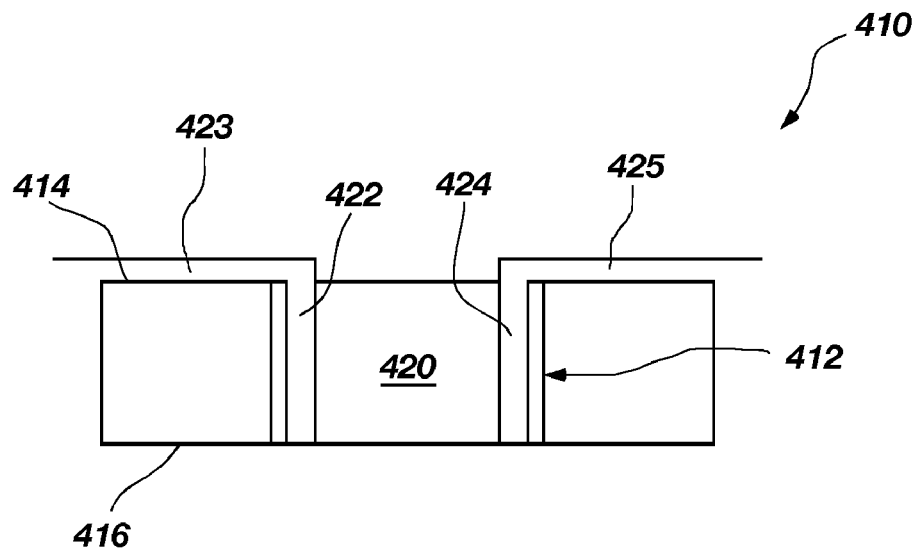
FIG. 8A is a side cross-sectional view of a multiconductor via of the present invention including a plurality of conductive traces extending therefrom.

Generally, two approaches may be employed forming elongated conductive elements (i.e., traces) extending from a multiconductor via of the present invention. In a first approach, conductive traces may be arranged to extend within a substantially common plane, arranged so as to not intersect one another. For instance, as shown in FIG. 8A, showing a side cross-sectional view of substrate 410, conductive elements 422 and 424 may be disposed within through-hole 412 formed between surfaces 414 and 416 and may be separated by dielectric material 420. Further, conductive traces 423 and 425 may extend from, respectively, conductive elements 422 and 424 and may extend within a substantially common plane. Conductive traces 423 and 425 may be formed upon surface 414 of substrate 410 by any suitable blanket deposition technique as known in the art, such as, for instance, CVD, PVD, ALD, sputtering, or plating, followed by selective etching.

Thus, as shown in FIG. 8A, conductive trace 423 and conductive element 422 may form a substantially continuous conductive structure for carrying electrical signals. Similarly, as shown in FIG. 5A, conductive trace 425 and conductive element 424 may form a substantially continuous conductive structure upon substrate 410 for carrying electrical signals. The conductive traces 423 and 425 may be formed prior to the formation of through-hole 412 and conductive elements 422 and 424 or subsequent thereto, without limitation. Explaining further, generally, conductive traces 423 and 425 may be formed prior to through-hole 412 and, during the formation of conductive elements 422 and 424, electrical connection therebetween, respectively may be accomplished (e.g., by forming at least a portion of conductive elements 422 and 424, respectively, upon a sidewall formed by conductive traces 423 and 425, respectively). Alternatively, conductive elements 422 and 424 may be formed prior to conductive traces 423 and 425, and, during the formation of conductive traces, electrical connection therebetween, respectively, may be accomplished (e.g., by superimposition) therebetween, respectively. Of course, respective electrical connection between conductive traces 423 and 425 and conductive elements 422 and 424 may be accomplished as known in the art, without limitation.

Further, as shown in FIG. 8A, conductive traces 423 and 425 extend away from and do not intersect (i.e., electrically communicate) with one another. Thus, conductive traces 423 and 425 may be electrically isolated from one another although lying substantially at least partially within the same plane. Of course, conductive traces 423 and 425 may be patterned to avoid electrical communication therebetween.

Figure 8B:
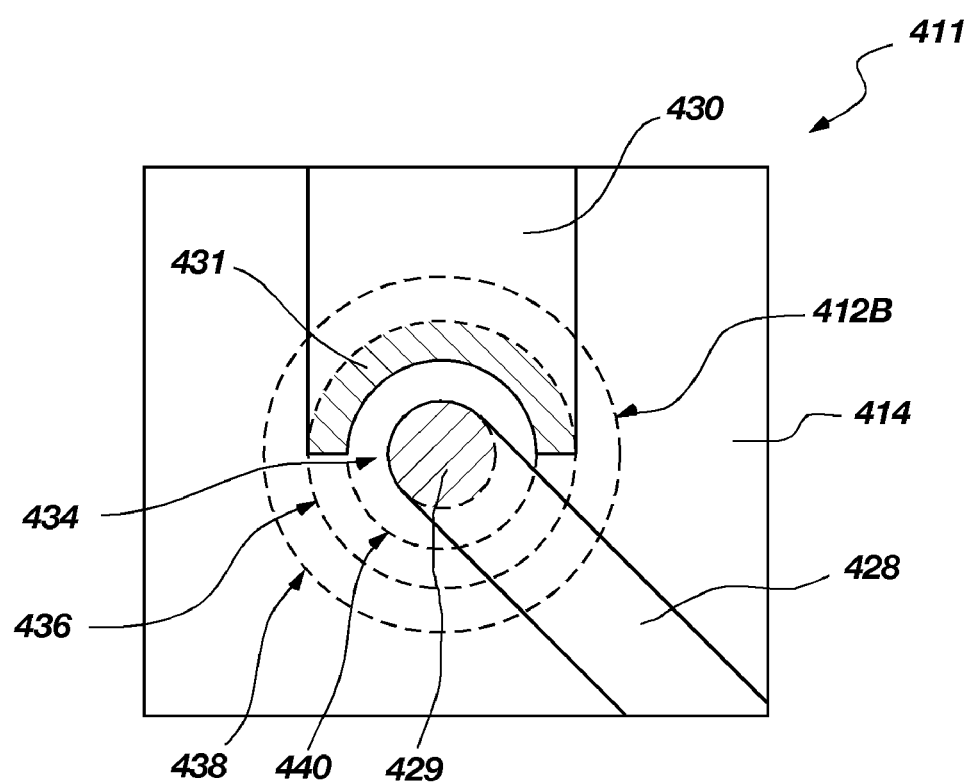
FIG. 8B is a top elevation view of another embodiment of a multiconductor via of the present invention including a plurality of conductive traces extending therefrom.

In one example of patterned traces extending in a substantially common plane, referring to FIG. 8B by way of example and not limitation, a through-hole 412B formed in substrate 411 may include a substantially ring-shaped conductive element 436 and a substantially cylindrical conductive element 434, arranged in an alternating pattern of increasing radius with dielectric layers 438 and 440. Further, conductive trace 430 may be formed over overlapping region 431 of conductive element 436, thus, electrically connecting therewith. Also, conductive trace 428 may be formed over overlapping region 429 of conductive element 434, thus, electrically connecting therewith. A thin dielectric layer may be placed over at least a portion of conductive element 436 over which conductive trace 428 extends or the still-exposed end portion of conductive element 436 transformed to a nonconductive state after formation of conductive trace 430 for electrical isolation, by techniques well known in the art. Thus, traces 428 and 430 may be sized and configured to extend over substrate 411 in a non-overlapping pattern.

Figure 8C:
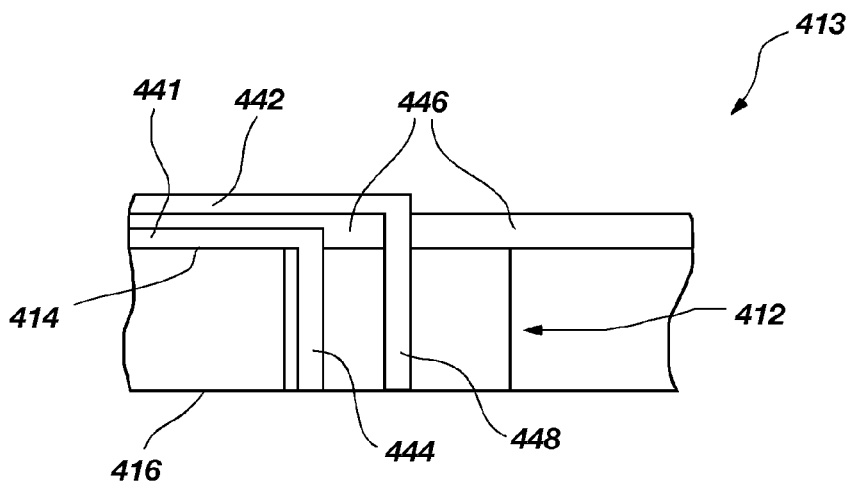
FIG. 8C is a side cross-sectional view of another embodiment of a multiconductor via including a plurality of conductive traces extending therefrom.

In a second approach, conductive traces may extend in different planes (generally with respect to a surface 414 or 416 of substrate 413) from respective conductive elements of a through via. As shown in FIG. 8C, substrate 413 may include a through-hole 412 having conductive elements 444 and 448 extending therethrough. Further, conductive traces 441 and 442 may be electrically communicative with conductive elements 444 and 448, respectively. Further, conductive traces 441 and 442, as shown in FIG. 8C, are separated by dielectric layer 446, which may be configured for inhibiting electrical communication therebetween. Of course, it should be appreciated that the presence of additional conductive traces may require additional dielectric layers separating same. Further, the present invention encompasses combinations of the above-discussed approaches for forming traces from a multiconductor via, as shown in FIGS. 8A-8C.

It should be noted that, although the embodiments of a via, including a plurality of conductive elements, as described hereinabove depict and describe conductive elements that extend substantially completely through the through-hole within which they are formed, the present invention is not so limited. Rather, at least one of the plurality of conductive elements may extend partially through the through-hole within which it is formed. Such a configuration may allow for inter-level electrical connections to be formed within the substrate.

Figure 9A:
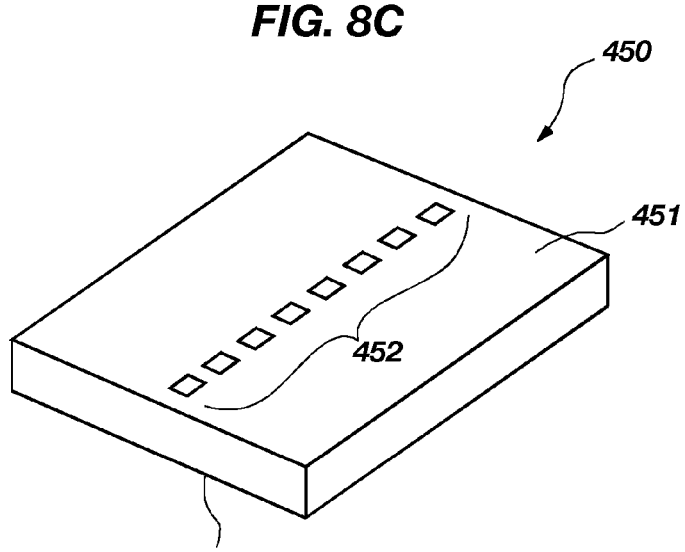
FIG. 9A is a perspective view of a semiconductor die.

In an additional aspect of the present invention, a semiconductor die 450, including an active surface 451, a back surface 453, and a plurality of bond pads 452 formed on the active surface 451, as shown in FIG. 9A in a perspective view, may be provided and may include at least one multiconductor via according to the present invention, as discussed in further detail hereinbelow. For instance, as shown in FIG. 9B, a plurality of multiconductor vias 454 may be formed in the semiconductor die 450 so that each multiconductor via 454 intersects with at least a plurality of bond pads 452 formed on the active surface 451 of semiconductor die 450.

Figure 9B:
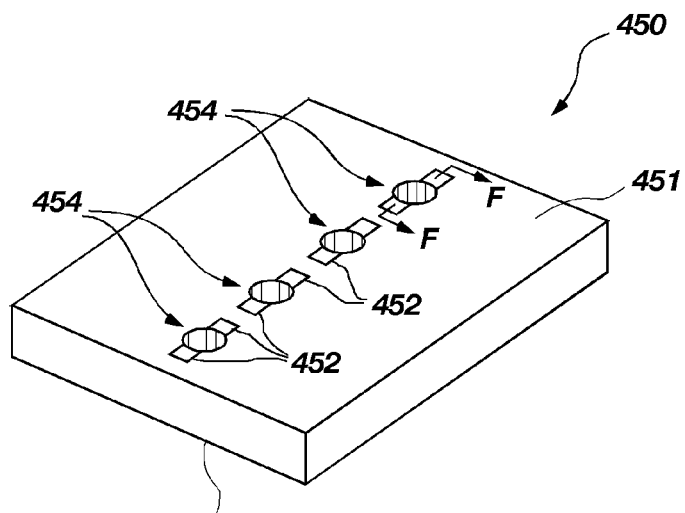
FIG. 9B is a perspective view of a semiconductor die including multiconductor vias.
Figure 9C:
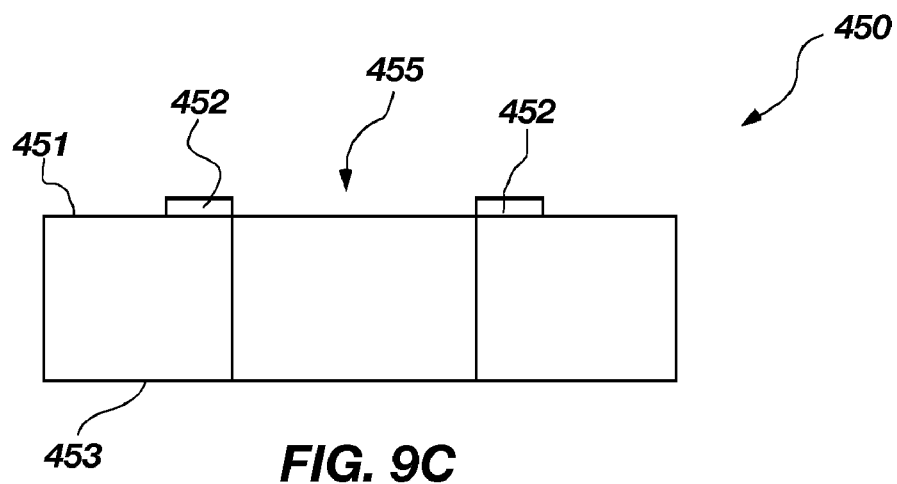
FIG. 9C is a side cross-sectional view of a through-hole formed in the semiconductor die shown in FIG. 9B, taken along reference line F-F.
Figure 9D:
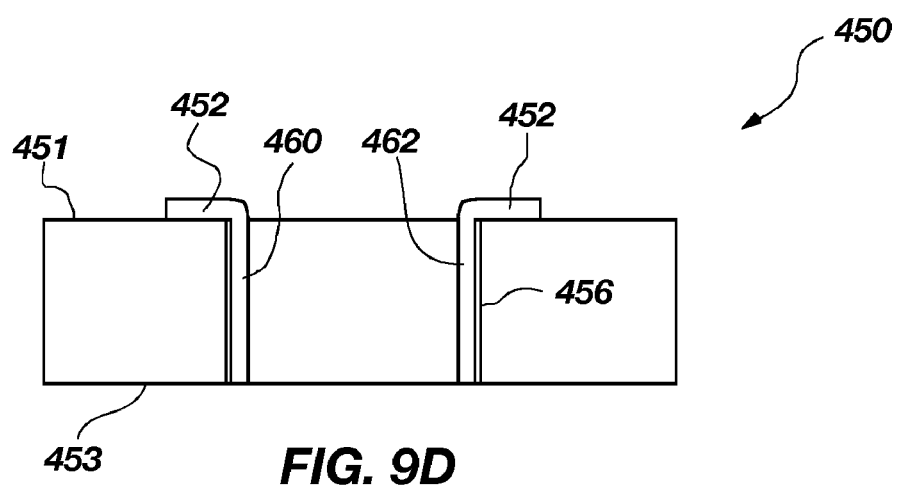
FIG. 9D is a side cross-sectional view of a multiconductor via of the present invention including conductive elements formed in the through-hole shown in FIG. 9C.
Figure 9E:
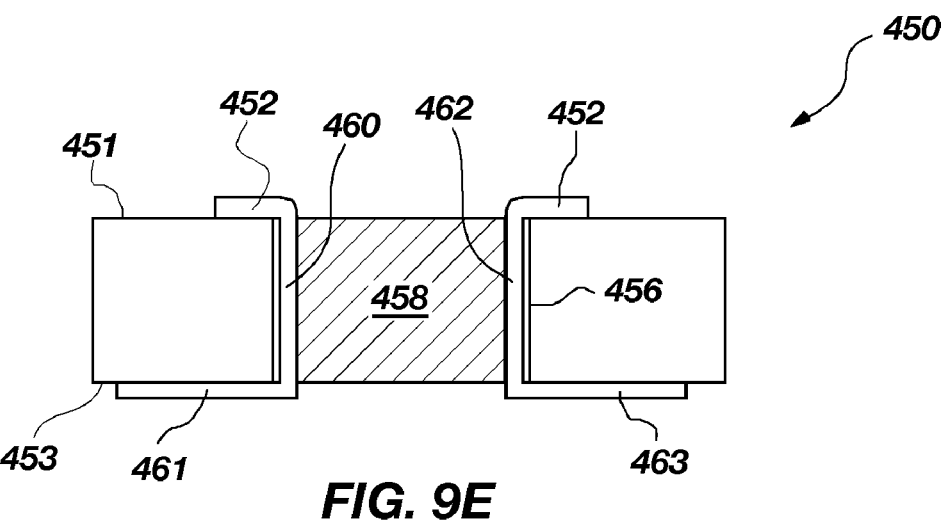
FIG. 9E is a side cross-sectional view of the multiconductor via shown in FIG. 9D, including conductive traces extending from the conductive elements of the multiconductor via.

In further detail, the method of forming multiconductor vias 454 will be described with reference to FIGS. 9C-9E, each of which shows a partial side cross-sectional view of semiconductor die 450 along reference line F-F, as shown in FIG. 9B. Moving to FIG. 9C, a through-hole 455 may be formed through adjacent bond pads 452. Further, as shown in FIG. 9D, a passivation or other dielectric layer 456 may be formed upon a sidewall of through-hole 455. Then, a seed layer (not shown) may be formed and patterned to form a plurality of seed layer regions within through-hole 455 as described hereinabove with respect to embodiments of a multiconductor via of the present invention. Conductive elements 460 and 462 may be formed upon the plurality of seed layer regions (not shown) by depositing (e.g., plating, electroplating, etc.) a conductive material thereon. Further, optionally, a dielectric material 458 may be deposited within through-hole 455, between conductive elements 460 and 462. Additionally, as shown in FIG. 9E, conductive traces 461 and 463 may be formed for electrical communication with conductive elements 460 and 462.

Figure 9F:
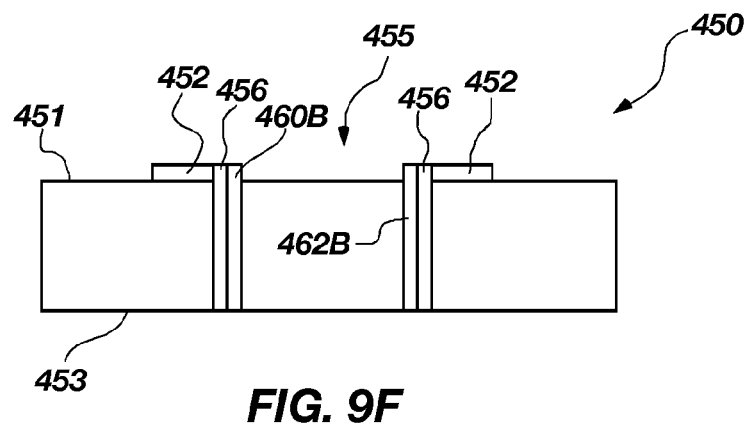
FIG. 9F is a side cross-sectional view of an alternative structure of a multiconductor via of the present invention including conductive elements formed in the through-hole shown in FIG. 9C.
Figure 9G:
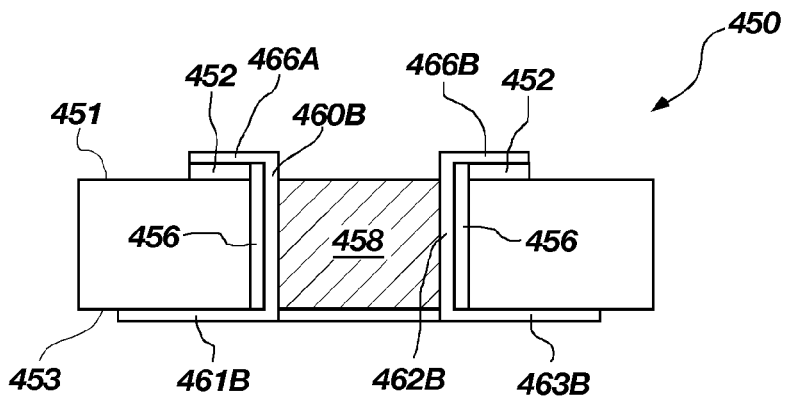
FIG. 9G is a side cross-sectional view of the multiconductor via shown in FIG. 9F, including conductive traces extending from the conductive elements of the multiconductor via.

Of course, generally, a multiconductor via of the present invention may be formed within a semiconductor die, without limitation. Further, in some embodiments, there may be a dielectric layer formed within a through-hole, rather than a passivation layer. For completeness, such a configuration is described with respect to FIGS. 9F and 9G, showing an alternate embodiment of multiconductor vias 454 as shown in FIG. 9B. For instance, as shown in FIG. 9F, a semiconductor die 450 may include through-hole 455 formed therethrough, dielectric layer 456 formed within the through-hole 455 and conductive elements 460B and 462B formed upon the dielectric layer 456. Thus, as shown in FIG. 9G, bond pads 452 and conductive elements 460B and 462B may be separated after formation of conductive elements 460B and 462B.

Thus, conductive traces 466A and 466B may be formed between conductive elements 460B and 462B and bond pads 452. Also, conductive traces 461B and 463B may be formed for electrical communication with conductive elements 460B and 462B, respectively. Deposition techniques as known in the art may be used, in combination with etch and resist processes, if necessary. For instance, selective plating (e.g., through a patterned mask) may be employed for forming conductive traces between conductive elements 460B and 462B and bond pads 452. In another alternative, a conductive material may be blanket deposited upon active surface 451 and over bond pads 452 and between bond pads and conductive elements 460B and 462B and etched to form respective electrical communication therebetween. Alternatively, conductive epoxy, solder paste, or other conductive semisolid material may be deposited (and subsequently processed, as desired) between conductive elements 460B and 462B and bond pads 452 for providing electrical communication therebetween.

Alternatively, conductive traces 466A and 466B may be formed between bond pads 452 and conductive elements 460B and 462B, respectively, by way of so-called maskless mesoscale materials deposition ("M³D"). For instance, a material may be aerosolized by using an ultrasonic transducer or a pneumatic nebulizer. Then, the aerosol stream may be focused using a flow guidance deposition head, which forms an annular, coaxial flow between the aerosol stream and a sheath gas stream. Further, selective deposition patterning may be accomplished by moving the substrate or deposition head relative to one another. The deposited material may be subsequently heated to form a substantially dense electrically conductive material. For instance, the deposited material may be heated in an oven or by exposure to a laser beam. In addition, conductive traces extending to or from a passive element of the present invention may be formed by way of maskless mesoscale materials deposition. Commercially available maskless mesoscale materials deposition apparatus are produced by Optomec of Albuquerque, N.M.

Figure 9H:
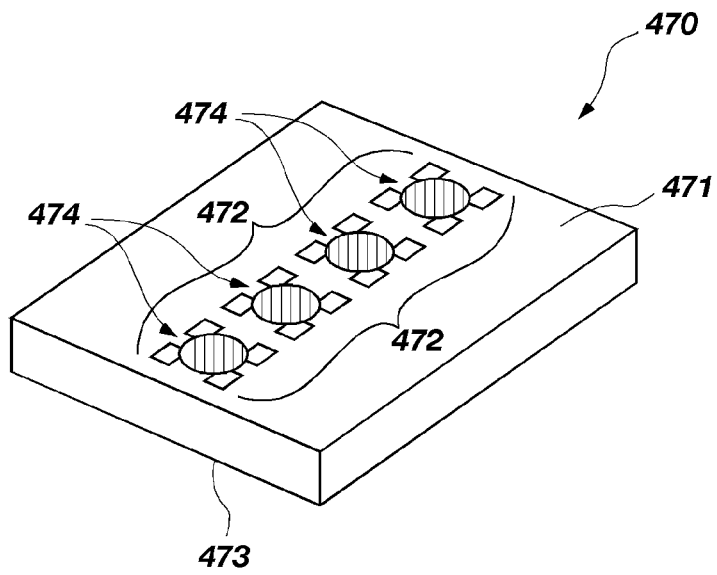
FIG. 9H is a perspective view of another embodiment of a semiconductor die of the present invention including multiconductor vias.

Of course, many alternative embodiments and configurations of a semiconductor wafer are contemplated by the present invention. For instance, as shown in FIG. 9H in a perspective view, a semiconductor die 470 including an active surface 471, a back surface 473, and a plurality of bond pads 472 formed on the active surface 471, may be provided and wherein a plurality of multiconductor vias 474 are formed in the semiconductor die 470 so that each multiconductor via 474 intersects with respective four bond pads 472 formed on the active surface 471 of semiconductor wafer 470.

Figure 10A:
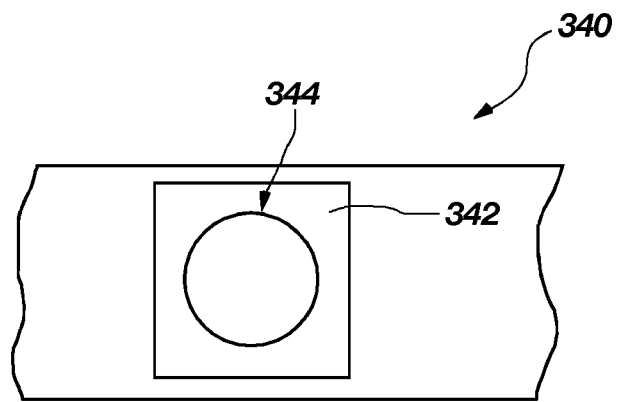
FIG. 10A is a top elevation view of a substrate including a through-hole formed within a periphery of a bond pad.
Figure 10B:
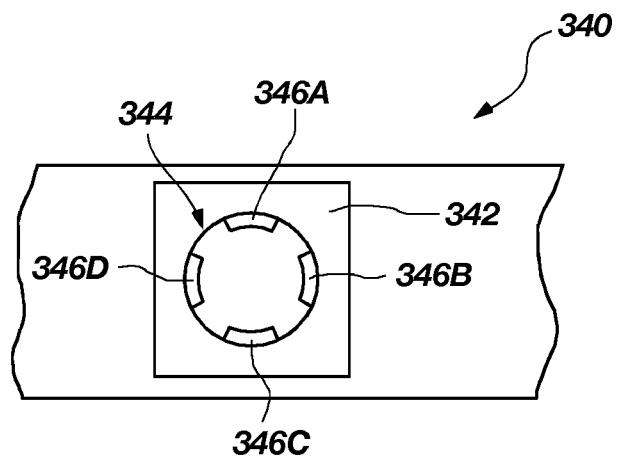
FIG. 10B is a top elevation view of the substrate shown in FIG. 10A, including a plurality of conductive elements formed in the through-hole.
Figure 10C:
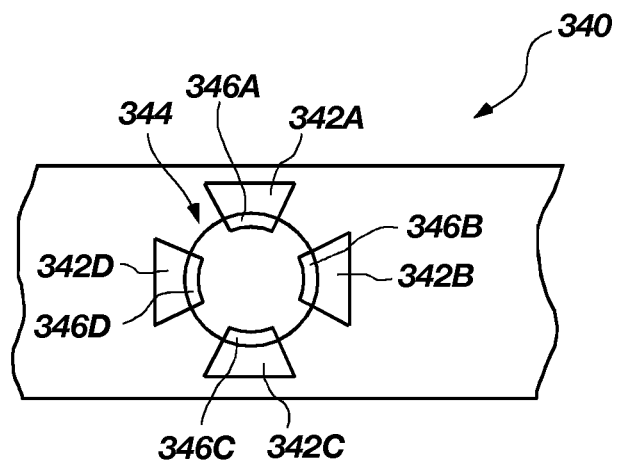
FIG. 10C is a top elevation view of the substrate shown in FIG. 10B including a patterned bond pad having separated regions associated with each of the plurality of conductive elements formed in the through-hole.

In another aspect of the present invention related to bond pads, a multiconductor via may be formed through a bond pad and the bond pad may be patterned in correspondence to the conductive elements of the multiconductor via. For instance, as shown in FIG. 10A in a top elevation view, a through-hole 344 may be formed into substrate 340 and intersecting with bond pad 342. Through-hole 344 may be entirely within the periphery of bond pad 342 or at least partially within the periphery of bond pad 342, without limitation. Further, as shown in FIG. 10B, conductive elements 346A, 346B, 346C, and 346D may be formed within through-hole 344 by any of the above-described methods or in any of the above-described embodiments. Further, bond pad 342 may be patterned, as shown in FIG. 10C, by laser ablation, etching, or as otherwise known in the art to form bond pad regions 342A, 342B, 342C, and 342D corresponding to conductive elements 346A, 346B, 346C, and 346D. Such a configuration may be advantageous for selectively forming electrical communication with conductive elements 346A, 346B, 346C, and 346D.

Additionally, in a further aspect of the present invention, a multiconductor via of the present invention may be employed in an assembly of a plurality of semiconductor dice (i.e., a multichip module). For instance, each of the plurality of semiconductor dice of a multichip module may include a multi conductor via having a plurality of conductive elements extending therethrough. Such a configuration may allow for ease in electrical communication with at least one of the bond pads of each of the plurality of semiconductor dice in a multichip module.

Figure 11A:
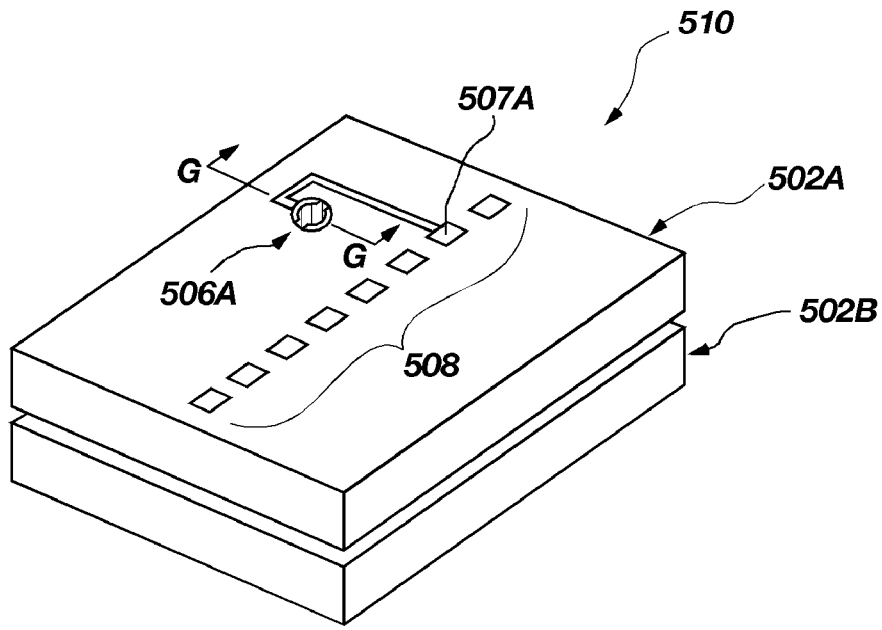
FIG. 11A is a perspective view of an embodiment of a multichip module of the present invention.

For example, a multichip module 510 is shown in a perspective view in FIG. 11A, which comprises two semiconductor dice 502A and 502B. Each of semiconductor dice 502A and 502B includes a plurality of bond pads 508, one of bond pads 508 comprising a "selection" bond pad, the selection bond pad of semiconductor die 502A being labeled 507A, and the selection bond pad of semiconductor die 502B not being shown as it is hidden under semiconductor die 502A.

A selection bond pad, as used herein, may comprise a chip-select bond pad, a clock select bond pad, a chip enable bond pad, or another bond pad as known in the art configured for controlling an operational state of a semiconductor die. Explaining further, stacked chips inputs and outputs (I/Os) may be typically electrically connected in parallel. Thus, I/Os may be typically controlled or accessed by way of a "row" and "column" organization scheme, termed CAS (column address strobe) and RAS (row address strobe). Therefore, a selection bond pad may be configured for enabling a particular function. Specifically, a "chip select" bond pad or trace may indicate which of the I/Os of a multichip module is being accessed. Further, a chip enable bond pad or trace may be configured for energizing or de-energizing a semiconductor die in a multichip module. Also, a clock enable bond pad or trace may be configured for turning the clock of a particular semiconductor die in a multichip module on or off.

Put another way, when the selection bond pad of a semiconductor die is energized with a suitable electrical signal, semiconductor die operations related to a function of the semiconductor die may be initiated. Without energizing the selection bond pad, operations related to such a function of the semiconductor die may not be initiated. Further, it should be appreciated that a selection bond pad may be suitably configured in operable combination with the circuitry and structure of a semiconductor die to achieve a desired function.

Figure 11C:
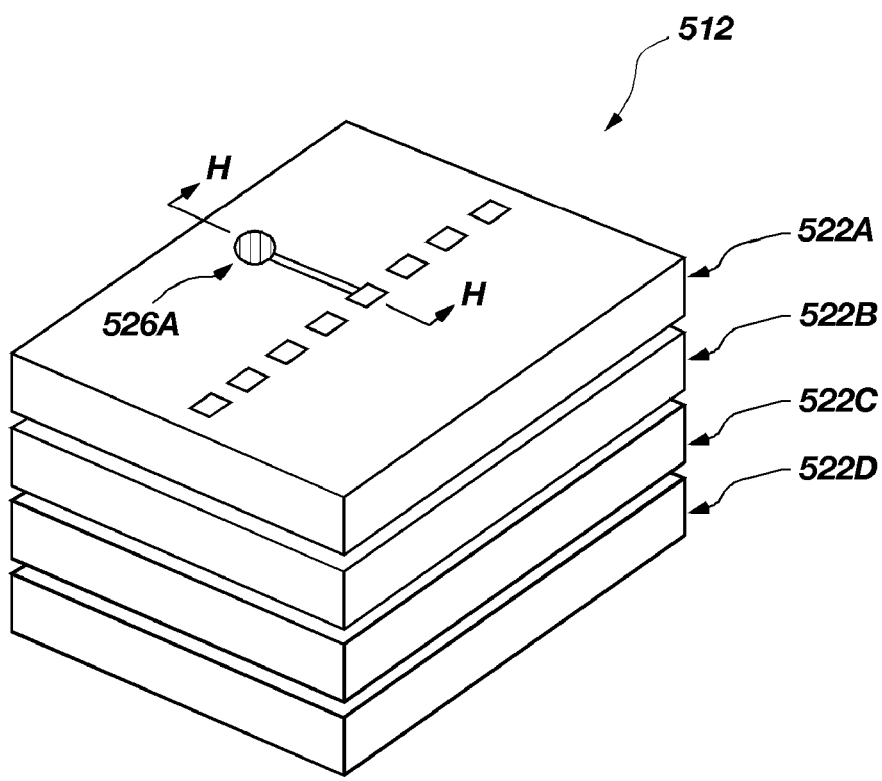
FIG. 11C is a perspective view of another embodiment of a multichip module of the present invention.
Figure 11B:
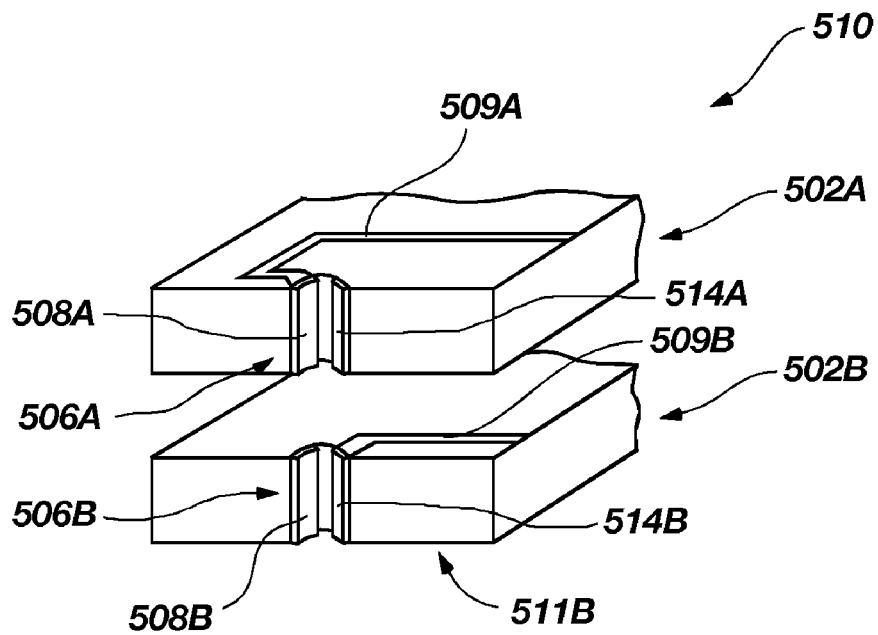
FIG. 11B is an enlarged partial schematic side cross-sectional view of the multichip module shown in FIG. 11A, taken along reference line G-G.

Turning to FIG. 11B, which shows a partial cross-sectional view of multichip module 510, taken along reference line G-G (FIG. 11A), conductive elements 508A and 514A of semiconductor die 502A extend within multiconductor via 506A, while conductive elements 508B and 514B of semiconductor die 50213 extend within multiconductor via 506B. Multiconductor via 506A may be aligned with multiconductor via 506B upon assembly of semiconductor die 502A with semiconductor die 502B. Semiconductor die 502A and semiconductor die 502B may be affixed to one another by way of an adhesive, such as an epoxy or a dielectric tape bearing adhesive on both sides thereof, or as otherwise known in the art. Further, conductive element 508A may be electrically communicative with conductive element 508B, responsive to assembly of semiconductor die 502A with semiconductor die 502B. In further detail, conductive element 508A may be electrically communicative with selection bond pad 507A of semiconductor die 502A via conductive trace 509A. Similarly, conductive element 508B may be electrically communicative with selection bond pad (not shown) of semiconductor die 502B via conductive trace 509B.

For instance, an amount of conductive material, such as conductive or conductor-filled epoxy or solder paste, may be deposited between conductive element 508A and conductive element 508B for facilitating electrical communication therebetween. Optionally, enlarged terminal pads in respective communication with conductive elements 508A and 508B may be formed upon the facing surfaces of semiconductor die 502A and 502B, for facilitating electrical communication between conductive element 508A and conductive element 508B. Also, regarding solder paste disposed between conductive element 508A and conductive element 508B, after such deposition, the assembly of semiconductor die 502A and semiconductor die 502B may be reflowed (i.e., heated) to form a solder bond between conductive element 508A and conductive element 508B. Electrical communication between conductive elements 514A and 514B may be similarly configured, or may not be facilitated, without limitation. It is also contemplated that an anisotropic (Z-axis) conductive adhesive may be disposed between superimposed conductive elements such as 508A and 508B to effect an electrical connection therebetween.

In this way, the selection bond pad 507A of semiconductor die 502A may be electrically communicative through both semiconductor die 502A and 502B, to a back side 511B of semiconductor die 502B, which may, in turn, be mounted to a carrier substrate (not shown) such as a printed circuit board and a terminal pad thereof electrically connected to selection bond pad 507A through conductive trace 509A and conductive elements 508A and 508B, while another terminal pad thereof is connected to a selection bond pad 507B (not shown) through conductive trace 509B and conductive element 514B. Such a configuration may be advantageous, as explained below with reference to FIGS. 11C and 11D, showing multichip module 512.

Explaining further, such a configuration may eliminate the need for forming a redistribution layer upon the active surface of a semiconductor die. For instance, if multiple semiconductor dice are arranged in a stacked relationship, a specific I/O (e.g., chip select) may overlay the same specific I/O of another, adjacent semiconductor die. Conventionally, since the trace for each I/O must be communicated to the bottom of the chip stack for external connection, it must be rerouted to a location where it can extend through an underlying chip. Therefore, conventionally, an RDL layer or trace is required to reroute the I/O to another location. However, as explained herein, a multiconductor via according to the present invention may eliminate the need to form an RDL layer or trace on the active surface of a semiconductor die to reroute an I/O to another location.

Figure 11D:
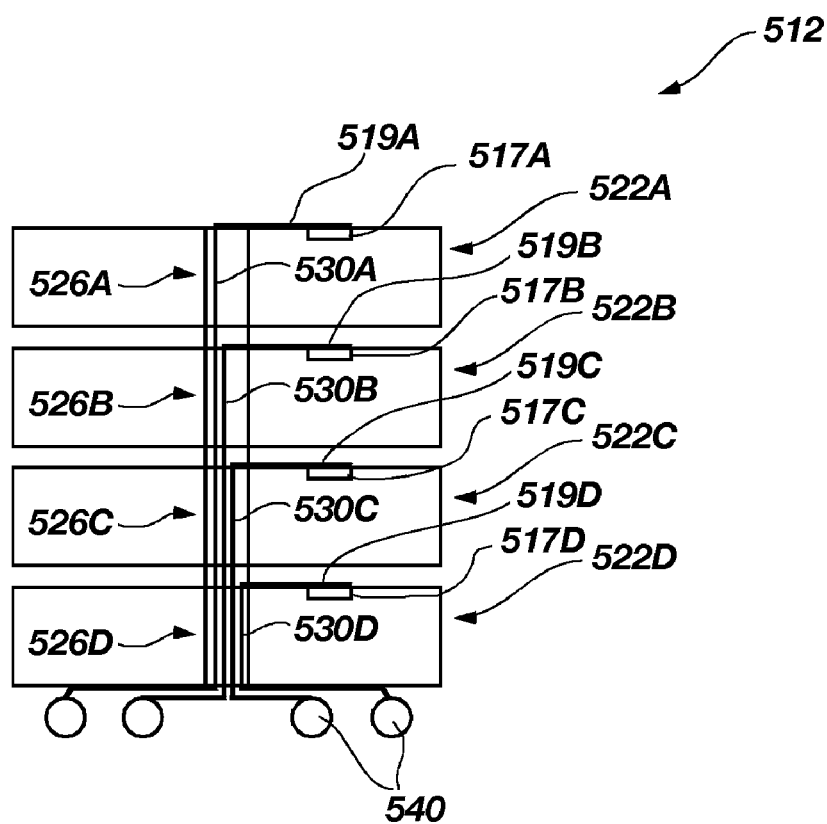
FIG. 11D is an enlarged partial schematic side cross-sectional view of the multichip module shown in FIG. 11C, taken along reference line H-H.

Multichip module 512 is shown in a perspective view in FIG. 11C, and in an enlarged schematic partial cross-sectional view taken along reference line H-H (FIG. 11C) in FIG. 11D. Multichip module 512 includes semiconductor dice 522A, 522B, 522C, and 522D, as shown in FIG. 11C, each of semiconductor dice 522A, 522B, 522C, and 522D is arranged in a stacked relationship. As shown in FIG. 11D, each of selection bond pads 517A, 517B, 517C, and 517D may be electrically communicative with a respective discrete conductive element 540. More particularly, each of selection bond pads 517A, 517B, 517C, and 517D may be electrically connected to conductive traces 519A, 519B, 519C, and 519D, respectively, and to conductive elements 530A, 530B, 530C, and 530D, respectively, extending within multiconductor vias 526A, 526B, 526C, and 526D, respectively. Discrete conductive elements 540 may comprise solder bumps or balls, other metal or alloy bumps, balls, studs or lands, conductive or conductor-filled epoxy posts, pillars or bumps, or other conductive structures as known in the art and may be configured for forming electrically conductive bonds to another structure, such as a carrier substrate.

Thus, multiconductor vias 526A, 526B, 526C, and 526D may be electrically communicative with one another, thus forming a plurality of conductive elements 530A, 530B, 530C, and 530D that extend substantially the entire length of the multiconductor vias 526A, 526B, 526C, and 526D (i.e., end-to-end) and conductive traces (e.g., a redistribution layer) 519A, 519B, 519C, and 519D may be formed for selectively electrically connecting to any one thereof. However, it may be desirable to avoid the use of conductive traces 519A, 519B, 519C, or 519D, as discussed hereinbelow.

Figure 11E:
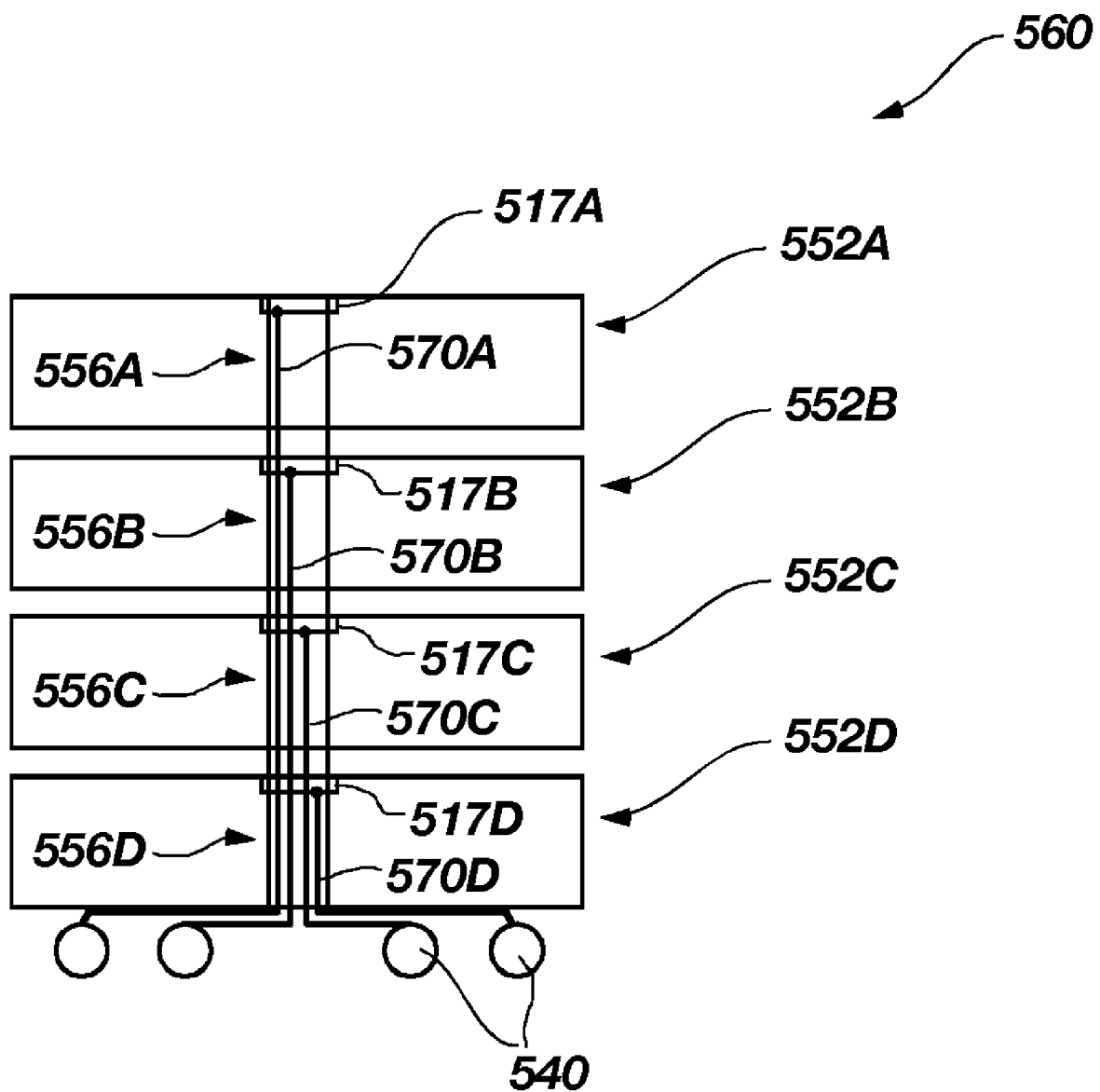
FIG. 11E is an enlarged partial schematic side cross-sectional view of yet a further embodiment of a multichip module of the present invention.

In another embodiment of the present invention, multichip module 560, shown in FIG. 11E in an enlarged schematic partial cross-sectional view, includes a plurality of semiconductor dice 552A, 552B, 552C, and 552D arranged in a stacked relationship. Multiconductor vias 556A, 556B, 556C, and 556D may be formed through semiconductor dice 552A, 552B, 552C, and 552D prior to assembly of multichip module 560. Each of multiconductor vias 556A, 556B, 556C, and 556D may, for convenience in fabrication, include conductive elements 570A, 570B, 570C, and 570D, although not all of such conductive elements are shown for each respective semiconductor die for clarity. Also, each conductive element 570A, 570B, 570C, and 570D may be electrically connected to each of selection bond pads 517A, 517B, 517C, and 517D, respectively. However, electrical communication between the conductive elements 570A, 570B, 570C, and 570D of each of multiconductor vias 556A, 556B, 556C, and 556D may be selectively enabled or formed.

More specifically, for instance, electrical communication of conductive element 570B extends from a discrete conductive element 540 and terminates at selection bond pad 517B. Similarly, electrical communication of conductive element 570C extends from discrete conductive element 540 and terminates at selection bond pad 517C. Also, electrical communication of conductive element 570D extends from discrete conductive element 540 and terminates at selection bond pad 517D. Electrical communication of conductive element 570A extends from conductive element 540, through each of multiconductor vias 556A, 556B, 556C, and 556D and terminates at selection bond pad 517A. Bond pads 517A-517D may be square or ring-shaped (the multiconductor via extending therethrough) to permit access along a circumference thereof to a segment of each laterally separated conductive element 570A, 570B, 570C and 570D within a respective semiconductor die 552A-552D to be stacked. A laser may then be used to sever a bond pad 517A-517D from those of conductive elements 570A-570D to which it is not to be operably coupled. Alternatively, each segment of a conductive element 570A-570D extending through a given semiconductor die 552A-552D may include a fuse therein, and fuses selectively blown as by a laser beam prior to stacking depending on where a given die 552A-552D is to lie in the stack. In either instance, it may be desirable for a bond pad 517A-517D to be adjacent, but not at the rim of, an associated via 556A-556D to enable a short trace comprising a fuse to extend between the bond pad and each of the segments of conductive elements 570A-570D. Alternatively, anti-fuses may be used to enable a connection between a segment of a conductive element 570A-570D and a bond pad 517A-517D. As mentioned above, discrete conductive elements 540 may comprise a number of different shapes and materials, and may be configured for forming electrically conductive bonds to another structure, such as a carrier substrate.

As yet a farther alternative, multichip module 560 may be formed by aligning or assembling each of semiconductor dice 552A, 552B, 552C, 552D in a stacked arrangement, and subsequently forming through-holes through each of the selection bond pads 517A, 517B, 517C, and 517D of semiconductor dice 552A, 552B, 552C, 552D, respectively. Further, once through-holes have been formed through each of semiconductor dice 552A, 552B, 552C, 552D, laterally separated conductive elements may be formed therein according to any suitable one of the above methods of the present invention. For example, a seed layer may be deposited and patterned, and conductive elements 570A, 570B, 570C, and 570D may be formed. Such a configuration may allow for relative flexibility in manufacturing of multichip modules.

The present invention contemplates that any multiconductor via of the present invention may be formed within a semiconductor die. For example, the present invention contemplates that any embodiment of a multiconductor via structure described with reference to FIGS. 1A-8C and 9A-10C may be included within a semiconductor die. Further, such a semiconductor die may be assembled within a multi chip module.

Figure 12:
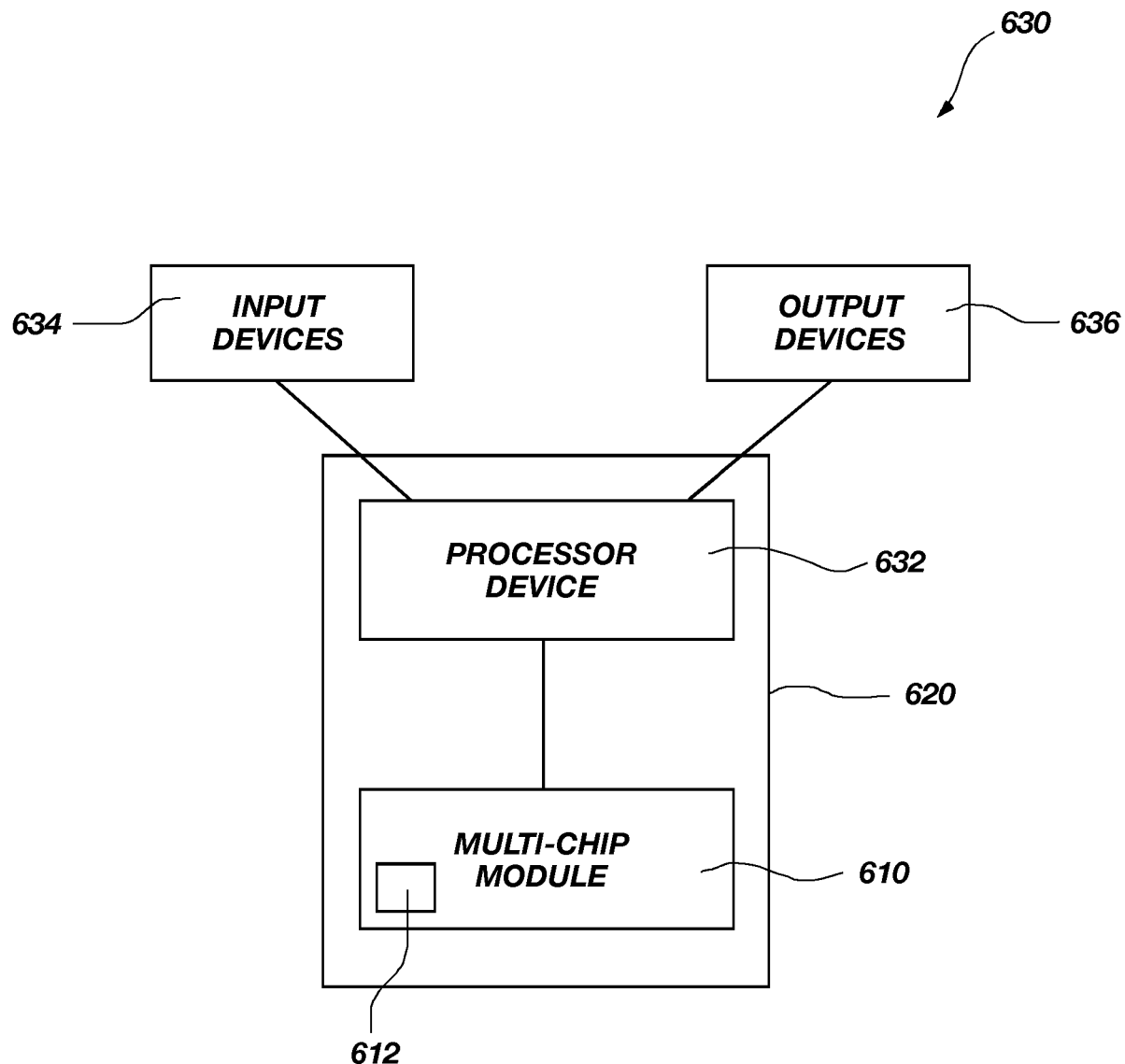
FIG. 12 is a schematic block diagram of a system according to the present invention.

It is further noted that the above-described embodiments of a multichip module according to the present invention may be utilized in a computer or other electronic component environment. For example, FIG. 12 shows a schematic block diagram of system 630 according to the present invention. Multichip module 610 may be included in a computing device 620, such as a hand-held computing device, a computer, or another electronic device. The computing device 620 may include a processor device 632, such as a central processing unit or other logic device operably coupled thereto. Multichip module 610 may include at least one semiconductor die 612 including at least one multiconductor via according to the present invention as described above. Further, processor device 632 may also be coupled with one or more appropriate input devices 634 (e.g., mouse, push-button, touch screen, communication interface, hard drive, etc.) and one or more output devices 636 (e.g., a display, printer, communication interface, hard drive, etc.) within system 630. It is also noted that the multichip module 610 or a semiconductor die 612 alone may be utilized in various computing environments, systems, and devices, such as, for example, cell phones, personal data assistants (PDAs), and other similar electronic devices.

As will readily be appreciated by those of ordinary skill in the art, the methods and apparatus of the present invention offer numerous advantages in comparison to conventional via structures and fabrication techniques. For example, vias may be formed with much larger diameters or other lateral dimensions, facilitating cleaning of the via interiors after formation as well as subsequent filling thereof with conductive and dielectric materials. The ability to employ through vias, including a plurality of conductors, enables the use of fewer through vias in a given die extending from an active surface to a back side thereof, facilitating fabrication of a redistribution layer of traces on the back side from fewer via locations and conserving surface area, or "real estate," on the active surface of the die. The ability to fabricate a via extending through a bond pad or in contact with two or more adjacent bond pads eliminates or reduces the need for a conventional redistribution layer of traces extending from the bond pads (termed inner level bonds) to redistributed locations on the active surface of the semiconductor die (termed outer level bonds) where through vias have conventionally been formed. This, in turn, requires that fewer vias be formed and saves overall processing time, as the plurality of conductive elements for each via of the present invention may be formed substantially in the same time as a single conductive element as used in conventional through vias, while consuming the same or little more real estate on the die. Vias according to the present invention including more than one plurality of conductive elements may take additional time to fabricate, but require even fewer vias. Further, the ability to employ through vias including a plurality of conductors facilitates stacking of a plurality of semiconductor dice while using a reduced number of vias. Further, the larger dimensions of through vias according to the present invention facilitate alignment of photolithography patterns and mutual alignment of multiple semiconductor dice in a stack and robust electrical connection between conductive elements of the various dice. Operationally, the plurality of conductive elements of the through vias of the present invention make chip select, chip enable, clock enable and other functions easier to configure in a stacked die assembly.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of forming at least one multiconductor via, the method comprising:
providing a substrate having a first surface and a second, opposing surface;
trepanning at least one through-hole extending between the first surface and the second, opposing surface;
substantially filling the at least one through-hole with a dielectric material;
forming a plurality of smaller, laterally separated through-holes within the dielectric material; and
depositing a conductive material within each of the plurality of smaller laterally separated through-holes to form a plurality of conductive elements extending through the at least one through-hole.

2. The method of claim 1, wherein trepanning comprises removing a substantially continuous peripheral perforation along an intended periphery of the at least one through-hole.

3. The method of claim 1, wherein trepanning the at least one through-hole comprises at least one of etching and laser ablating.

4. The method of claim 3, further comprising etching a sidewall of the at least one through-hole subsequent to trepanning the at least one through-hole.

5. The method of claim 1, wherein substantially filling the at least one through-hole with the dielectric material comprises substantially filling the at least one through-hole with at least one of a dielectric polymer, a ceramic paste, an epoxy, a BT resin, a polyimide, a benzocyclobutene, a glass, and a polybenzoxazole.

6. The method of claim 1, wherein substantially filling the at least one through-hole with the dielectric material comprises substantially filling the at least one through-hole with the dielectric material by way of at least one of an injection process, a screen-printing process, a capillary process, a spin-on process, and a vacuum-draw process.

7. The method of claim 1, wherein forming a plurality of smaller, laterally separated through-holes within the dielectric material comprises at least one of laser ablation and etching.

8. The method of claim 1, wherein depositing a conductive material within each of the plurality of smaller, laterally separated through-holes comprises:
forming a seed layer within each of the plurality of smaller, laterally separated through-holes formed within the dielectric material; and
plating a metal upon the seed layer within each of the plurality of smaller, laterally separated through-holes.

9. The method of claim 1, wherein depositing a conductive material within each of the plurality of smaller, laterally separated through-holes comprises depositing conductive nanoparticles within the plurality of smaller, laterally separated through-holes.

10. The method of claim 1, wherein depositing a conductive material within each of the plurality of smaller, laterally separated through-holes comprises depositing solder paste within each of the plurality of smaller, laterally separated through-holes.

11. A method of forming at least one multiconductor via, comprising:
   providing a substrate having a first surface and a second, opposing surface;
   forming at least one cavity extending into the substrate from the first surface to an intermediate surface lying between the first surface and the second, opposing surface;
   forming a plurality of laterally separated protruding structures extending from the intermediate surface of the at least one cavity toward the first surface of the substrate;
   depositing conductive material over exteriors of the plurality of laterally separated protruding structures;
   depositing dielectric material between the conductive material deposited over exteriors of the plurality of laterally separated protruding structures; and
   thinning the substrate from the second, opposing surface toward the first surface at least to a level of the intermediate surface to form at least one through-hole extending through the substrate and a plurality of conductive elements extending therethrough.

12. The method of claim 11, wherein depositing conductive material over exteriors of the plurality of laterally separated protruding structures comprises:
   forming a seed layer over the exterior of the plurality of laterally separated protruding structures; and
   plating a metal over the seed layer.

13. The method of claim 11, wherein forming the at least one cavity includes forming the plurality of laterally separated protruding structures extending from the intermediate surface toward the first surface of the substrate.

14. The method of claim 11, further comprising depositing a conductive material over at least a portion of an interior sidewall of the at least one cavity.

15. The method of claim 14, wherein thinning the substrate further comprises forming at least one conductive element comprising the conductive material deposited over at least the portion of the interior sidewall of the at least one cavity.

16. A method of forming at least one multiconductor via, the method comprising:
   providing a substrate having a first surface and a second, opposing surface;
   forming at least one cavity extending into the substrate from the first surface to an intermediate surface lying between the first surface and the second, opposing surface;
   forming a plurality of laterally separated conductive nanotubes extending generally from the intermediate surface toward the first surface;
   depositing dielectric material substantially surrounding, within the at least one cavity, the plurality of laterally separated conductive nanotubes;
   thinning the substrate from the second, opposing surface toward the first surface at least substantially to a level of the intermediate surface to form at least one through-hole extending through the substrate and the plurality of laterally separated conductive nanotubes extending therethrough.

17. The method of claim 16, wherein forming a plurality of laterally separated conductive nanotubes comprises forming a plurality of laterally separated conductive nanotubes comprising at least one of tungsten, nickel, carbon, cobalt, and iron.

18. The method of claim 16, wherein forming the plurality of laterally separated conductive nanotubes comprises employing at least one of an arc discharge process, a laser evaporation process, and a pyrolysis process.

19. The method of claim 16, wherein forming the at least one cavity extending to the intermediate surface lying between the first surface and the second, opposing surface further comprises forming a conductive layer within the at least one cavity on the intermediate surface.

20. The method of claim 19, wherein thinning the substrate to form the at least one through-hole extending through the substrate and the plurality of laterally separated conductive nanotubes extending therethrough comprises thinning the substrate substantially to the conductive layer.

* * * * *